United States Patent
Satoh

(10) Patent No.: US 6,949,983 B2
(45) Date of Patent: Sep. 27, 2005

(54) HIGH-FREQUENCY PIEZOELECTRIC OSCILLATOR

(75) Inventor: Tomio Satoh, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 101 days.

(21) Appl. No.: 10/719,874

(22) Filed: Nov. 21, 2003

(65) Prior Publication Data

US 2004/0104783 A1 Jun. 3, 2004

(30) Foreign Application Priority Data

Nov. 29, 2002 (JP) ........................................ 2002-348071
Feb. 14, 2003 (JP) ........................................ 2003-037517

(51) Int. Cl.[7] ............................ H03B 5/32; H03B 5/36; H03B 7/00
(52) U.S. Cl. .................. 331/158; 331/116 R; 331/132; 331/177 V
(58) Field of Search ................ 331/36 C, 115, 331/116 R, 116 FE, 132, 158, 159, 175, 177 V

(56) References Cited

U.S. PATENT DOCUMENTS

| | | | | |
|---|---|---|---|---|
| 3,569,865 A | * | 3/1971 | Healey, III | 331/116 R |
| 4,600,900 A | * | 7/1986 | Renoult et al. | 331/116 R |
| 4,646,034 A | * | 2/1987 | Chauvin et al. | 331/116 R |
| 4,843,349 A | * | 6/1989 | Nugent et al. | 331/116 R |
| 5,053,773 A | * | 10/1991 | Mosinski | 342/26 B |

* cited by examiner

*Primary Examiner*—David Mis
(74) *Attorney, Agent, or Firm*—Koda & Androlia

(57) ABSTRACT

In the high-frequency piezoelectric oscillator, capacitors C1, C2 as a part of a load capacitor are connected between a base of a transistor TR1 and the ground. The connection point of the capacitors C1, C2 is connected to an emitter of the transistor TR1, and is grounded via an emitter resistor R1. A base bias circuit consisting of resistors RB1 and RB2 is connected to the base of the transistor TR1. A piezoelectric vibrator, an inductor, and a resistor are connected in parallel, and connected between the base of the transistor TR1. A capacitor is connected to the parallel circuit and grounded. A collector of the transistor and a power supply line are connected together.

7 Claims, 22 Drawing Sheets

HIGH-FREQUENCY PIEZOELECTRIC OSCILLATOR

BACKGROUND OF THE INVENTION

1. Field of the Invention

The present invention relates to a high-frequency piezoelectric oscillator, and more particularly, to a high-frequency piezoelectric oscillator having en excellent stabilization characteristics with suppressing unwanted resonance.

2. Description of the Related Art

Conventionally, an odd-order overtone, for example, third, fifth, and seventh-overtone of a vibrator is utilized to obtain oscillation in high frequency. In order to obtain the overtone oscillation, a harmonic selection circuit having high negative resistance at a desired frequency is provided in the oscillation circuit. FIG. 22 illustrates one example of a conventional Colpitts type oscillator. A capacitor C11 that becomes a part of a load capacitance of the oscillation circuit is connected between a base and an emitter of a transistor TR11. A parallel resonance circuit consisting of a capacitor C12 and an inductor L11 is connected to the emitter of the transistor TR11. A parallel circuit of a capacitor 13 and an emitter resistor R11 are connected in series to the parallel resonance circuit, and are grounded. A base bias circuit consisting of a resistor RB11 and a resistor RB12 is connected to a base of the transistor TR11. A series circuit of a piezoelectric vibrator (X'tal) and a capacitor C14 is connected between the base of the transistor TR11 and the ground. A collector of the transistor TR11 and a power supply line (VCC) are connected together.

In the present circuit, an oscillation output cannot be obtained when a desired frequency becomes 600 MHz or above. That is, the resonance frequency of a parallel resonance circuit comprised of the capacitor C12 and the inductor L11 can be set to a desired level, however, when the frequency is 600 MHz or above, an impedance of the piezoelectric vibrator lowers due to an interelectrode capacitance C0 of the piezoelectric vibrator. Accordingly, sufficient negative resistance cannot be generated in an oscillation loop of the oscillation circuit. To overcome this difficulty, as shown in FIG. 23, the inductor L20 is inserted in parallel into the piezoelectric vibrator (X'tal). The interelectrode capacitance C0 is canceled by matching the parallel resonance frequency of the interelectrode capacitance C0 and the inductor L20 with the oscillation frequency. Since the parallel circuit of the interelectrode capacitance C0 and the inductor L20 prevents deterioration of the negative resistance of the oscillation circuit and provides high selectivity, a high frequency oscillation can be achieved.

In order to make clear a difference between the present invention and the conventional circuit, the circuit shown in FIG. 23 will be explained in further detail. According to the conventional circuit, capacitors C21 and C22 that form a part of the negative capacitor are connected between the base of the transistor TR21 and the ground. The connection point of the capacitors C21 and C22 is connected to an emitter of the transistor TR21, and is grounded via a resistor R21. A base bias circuit consisting of a resistor RB21 and a resistor RB22 is connected to abase of the transistor TR21. A parallel circuit of the piezoelectric vibrator (X'tal) and the inductor L20 is connected to a capacitor C23, and a series circuit of the parallel circuit and the capacitor is connected between the base of the transistor TR21 and the ground. Further, a collector of the transistor TR21 and the power supply line (Vcc) are connected.

FIG. 24 illustrates an equivalent circuit model of the conventional circuit shown in FIG. 23. In FIG. 24, the piezoelectric vibrator is indicated by the equivalent circuit comprising a reactance L1, capacitance C1, C0, and resistance R1, and an oscillation circuit is indicated by negative resistance −Rc and reactance Xc. FIG. 26 illustrates another equivalent circuit model of the conventional circuit in which a reactance of a parallel resonance circuit comprised of the capacitance C0 and inductance L0 shown in FIG. 24 is presented as X0.

Expressions for an oscillation condition are as follows.

$$X_c = \frac{1}{\omega \cdot C_c}, \ldots X_0 \quad (1)$$

$$= \frac{1}{\omega \cdot C_0\left(\frac{\omega_0^2}{\omega^2} - 1\right)}, \ldots C_\alpha$$

$$= C_0\left(1 - \frac{\omega_0^2}{\omega^2}\right), \ldots C_L = -\frac{1}{\omega \cdot X_L},$$

$$\ldots X_c = \frac{1}{\omega \cdot C_c}, \ldots X_0 \quad (2)$$

$$= \frac{1}{\omega \cdot C_0}\left(\frac{\omega^2}{\omega_0^2} - 1\right) \ldots R_L = \frac{-R_c X_0^2}{R_c^2 + (X_0 - X_c)^2}, \ldots X_L$$

$$= \frac{X_0\{R_c^2 - X_c(X_0 - X_c)\}}{R_c^2 + (X_0 - X_c)^2}$$

$$\ldots R_1 + R_L = 0 \quad (3)$$

$$\cdot \omega L_1 + \frac{1}{\omega \cdot C_1} + X_L = 0$$

FIG. 25 illustrates a result of carrying out a simulation about characteristics of negative resistance Rc and capacitance Cc of a conventional Colpitts oscillation circuit. The axis of ordinates represents negative resistance, and the axis of abscissas represents frequency. From FIG. 25, it is clear that negative resistance does not occur when the frequency is about 400 MHz or below. However, negative resistance considerably occurs over 400 MHz frequencies. It can be seen that negative resistance occurs sufficiently at 2 GHz.

Impedance ZL is obtained and Exps. (4) and (5) are obtained based on the equivalent circuit shown in FIG. 26. An Exp. (6) that shows a relationship between the resistance RL and the reactance XL shown in FIG. 27 is obtained from ZL.

$$\ldots Z_L = \frac{jX_0(-R_c - jX_c)}{-R_c - jX_c + jX_0}, \ldots X_c = \frac{1}{\omega \cdot C_c}, \ldots X_0 \quad (4)$$

$$= \frac{1}{\omega \cdot C_0\left(\frac{\omega_0^2}{\omega^2} - 1\right)}$$

$$\ldots = \frac{X_0(X_0 - jR_c)}{-R_c + j(X_0 - X_c)} \quad (5)$$

$$= \frac{X_0(X_c - jR_c)\{-R_c - j(X_0 - X_c)\}}{R_c^2 + (X_0 - X_c)^2}$$

$$= \frac{-X_0(X_c - jR_c)\{R_c + j(X_0 - X_c)\}}{R_c^2 + (X_0 - X_c)^2} \ldots$$

$$= \frac{-X_0[X_cR_c + R_c(X_0 - X_c) + j\{X_c(X_0 - X_c) - R_c^2\}]}{R_c^2 + (X_0 - X_c)^2} \ldots$$

$$= \frac{-X_0[R_cX_0 + j\{X_c(X_0 - X_c) - R_c^2\}]}{R_c^2 + (X_0 - X_c)^2}$$

-continued $$R_L = \frac{-R_c X_0^2}{R_c^2 + (X_0 - X_c)^2}, \quad \ldots X_L \quad (6)$$

$$= \frac{-X_0\{X_c(X_0 - X_c) - R_c^2\}}{R_c^2 + (X_0 - X_c)^2}$$

$$= \frac{X_0\{R_c^2 - X_c(X_0 - X_c)\}}{R_c^2 + (X_0 - X_c)^2} \quad \ldots R_L$$

$$= \frac{-R_c X_0^2}{R_c^2 + S^2}, \quad \ldots X_L$$

$$= \frac{X_0\{R_c^2 - X_c S\}}{R_c^2 + S^2}, \quad \ldots \Leftarrow, \quad \ldots S = X_0 - X_c$$

FIG. 28 illustrates characteristics of a load resistance RL shown in FIG. 27. The axis of ordinates represents negative resistance Rc, and the axis of abscissas represents frequency. From FIG. 28, it is clear that, a largest negative resistance Rc is −300Ω at 600 MHz. The circuit shown in FIG. 27 constitutes an unwanted oscillation loop shown in FIG. 30, and the circuit oscillates in the resonance frequency of reactance X0+Xc=0. The oscillation loop includes negative resistance −Rc, and has no factor of anti-negative resistance. Therefore, oscillation occurs very easily. The Exp. (7) represents a frequency condition fω=0. FIG. 31 shows a frequency relationship.

$$\ldots F = X_0 + X_c = \frac{1}{\omega \cdot C_0\left(\frac{\omega_0^2}{\omega} - 1\right)} - \frac{1}{\omega \cdot C_c} = 0 \quad (7)$$

FIG. 31 is a graph of unwanted resonance frequency when ft is Cc=3, 5, 10, 30, and 100 pF respectively in a condition that C0=3 pF, the parallel resonance frequency is f0=600 MHz, and the circuit negative resistance Rc=−100Ω. The frequency when X0−Xc=0 on each characteristic curve is unwanted resonance frequency.

FIG. 32 illustrates a relationship between unwanted resonance frequency and circuit capacitance. The axis of ordinates represents unwanted resonance frequency, and the axis of abscissas represents circuit capacitance. In the present circuit, X0 works as inductor at a low frequency side of the parallel resonance frequency, and this has a possibility of bringing about unwanted oscillation when the inductor is connected with the circuit capacitance at the circuit side. For example, when the parallel resonance frequency of the interelectrode capacitance C0 and the inductor L0 is set to 600 MHz and also when C0=3 pF, the parallel resonance frequency is 590 MHz when the circuit capacitance Cc=1 pF, and the parallel resonance frequency is 100 MHz when the circuit capacitance Cc=100 pF. However, from the above result of the simulation of negative resistance, there is a possibility that oscillation occurs at an unwanted resonance point in the vicinity of the parallel resonance frequency. Further, when an extension coil L1 is used to enlarge a variable range in the oscillation circuit loop, unwanted oscillation occurs in a wide band in connection with a large capacitance generated in the vicinity of the resonance point as shown in FIG. 29.

According to the conventional high-frequency oscillation circuit shown in FIG. 23, unwanted oscillation contributed by the oscillation circuit and the inductor L20 as explained above is easily occurred. Further more, when an extension coil for expanding a frequency variable range is inserted into the oscillation loop, unwanted oscillation occurs easily at the parallel resonance frequency defined by the interelectrode capacitance C0 and the inductor L20. Further, a high negative resistance cannot be obtained easily by the conventional oscillation circuits explained the above. Therefore, there are some report regarding experimental results of the high frequency oscillation circuit, but there is substantially no success in practical applications.

SUMMARY OF THE INVENTION

The present invention has been made in the light of the above problems. It is an object of the present invention to provide a high-frequency piezoelectric oscillator having high stability characteristics, and the oscillator suppress unwanted oscillation by decreasing the interelectrode capacitance C0.

It is another object of the present invention to provide a high-frequency piezoelectric oscillator that can prevent the occurrence of unwanted oscillation due to the use of an extension coil when the extension coil is provided in an oscillation loop in order to enlarge the oscillation frequency variable range.

The present invention has been made to solve the above problems. According to a first aspect of the present invention, there is provided a high-frequency piezoelectric oscillator including a piezoelectric oscillator having a piezoelectric element that is excited in a predetermined frequency, and an oscillation amplifier that oscillates the piezoelectric element by flowing current to the piezoelectric element, wherein an inductor and a resistor are insertion connected in parallel respectively to the piezoelectric oscillator of the high-frequency piezoelectric oscillator, and resonance frequency of a parallel resonance circuit consisting of the inductor and the resistor is set to the vicinity of the oscillation frequency of the high-frequency piezoelectric oscillator thereby to increase negative resistance applied to a series arm of the piezoelectric element and suppress unwanted oscillation due to the inductor.

According to a second aspect of the present invention, there is provided a high-frequency piezoelectric oscillator including a piezoelectric oscillator having a piezoelectric element that is excited in a predetermined frequency, and an oscillation amplifier that oscillates the piezoelectric element by flowing current to the piezoelectric element, wherein a circuit having an inductor and a variable capacitance diode connected in series and a resistor are insertion connected in parallel respectively to the piezoelectric oscillator of the high-frequency piezoelectric oscillator, resonance frequency of a parallel resonance circuit consisting of the inductor and the resistor is set to the vicinity of the oscillation frequency of the high-frequency piezoelectric oscillator, thereby to increase negative resistance applied to a series arm of the piezoelectric element and externally fine adjust the capacitance of the variable capacitance diode so as to optimize oscillation and make it possible to control frequency.

According to a third aspect of the present invention, there is provided a high-frequency piezoelectric oscillator including a piezoelectric oscillator having a piezoelectric element that is excited in a predetermined frequency, and an oscillation amplifier that oscillates the piezoelectric element by flowing current to the piezoelectric element, wherein a first inductor and a resistor are connected in parallel respectively to the piezoelectric oscillator of the high-frequency piezoelectric oscillator, the connection point is grounded via a circuit having a second inductor and a variable capacitance diode connected in series, and resonance frequency of a parallel resonance circuit consisting of the first inductor and the resistor is set to the vicinity of the resonance frequency of the high-frequency piezoelectric oscillator, thereby to increase negative resistance applied to a series arm of the piezoelectric element and externally fine adjust the capacitance of the variable capacitance diode so as to optimize oscillation and make it possible to control frequency.

According to a fourth aspect of the present invention, there is provided a high-frequency piezoelectric oscillator according to any one of the first to third aspects, wherein the following relationships are fulfilled:

$$R_1 + R_L = 0 \quad \text{(I)}$$

$$\cdot \omega L_1 + \frac{1}{\omega \cdot C_1} + X_L = 0$$

when $$X_0 = \frac{1}{\omega C_0} \times \frac{1}{\left(1 - \frac{\omega_0^2}{\omega^2}\right)} = \frac{1}{\omega C_0} \times \frac{1}{\left(\frac{\omega_0^2}{\omega^2} - 1\right)}$$

$$z_0 = \frac{R_0 X_0^2}{R_0^2 + X_0^2} + j \frac{X_0 R_0^2}{R_0^2 + X_0^2}$$

$$r_\alpha = \frac{R_0 X_0^2}{R_0^2 + X_0^2}, \quad \dots X_\alpha = \frac{X_0 R_0^2}{R_0^2 + X_0^2},$$

$$Z_L = \frac{-r_\alpha R_c + X_\alpha X_c - j(X_\alpha R_c + X_c r_\alpha)}{r_\alpha - R_c + j(X_\alpha - X_c)}, \quad \dots$$

$$A = r_\alpha - R_c, \quad \dots B = X_\alpha - X_c, \quad \dots C = R_c^2 + X_c^2, \quad \dots D = r_\alpha^2 + X_\alpha^2$$

$$R_L = \frac{r_\alpha \times C - R_c \times D}{A^2 + B^2}, \quad \dots X_L = \frac{X_c \times D - X_\alpha \times C}{A^2 + B^2},$$

where −Rc represents the negative resistance, Cc represents circuit capacitance, C0 represents interelectrode capacitance of the piezoelectric oscillator, X0 represents reactance of a parallel circuit of the inductor L0, R0 represents resistance of the resistor, −Xc represents circuit capacitance of the circuit, rα represents parallel connection resistance of the X0 and R0, Xα represents reactance, RL represents negative resistance of the series arm of the oscillator, XL represents reactance, and (I) represents an oscillation condition.

According to a fifth aspect of the present invention, there is provided a high-frequency piezoelectric oscillator according to the first aspect wherein $\omega_1 < \omega_T < \omega_2$ (Exp. 1) is fulfilled, when $\omega_T$ represents unwanted resonance non-angular frequency, $C_o$ represents interelectrode capacitance of the oscillator, Rc represents an absolute value of negative resistance of an additional resistor and an oscillation circuit that are connected in parallel to the $C_o$, $L_o$ represents an additional inductor that is connected in parallel to the $C_o$, and $\omega_o$ represents parallel resonance angular frequency of the $C_o$ and $L_o$, where (Exp. 2) to (Exp. 4) are fulfilled $$\dots \omega_1 = \sqrt{\omega_0^2 + \frac{K - \sqrt{K(K + 4\omega_0^2)}}{2}}, \quad \dots \omega_2 \quad \text{(Exp. 2)}$$

$$= \sqrt{\omega_0^2 + \frac{K + \sqrt{K(K + 4\omega_0^2)}}{2}}, \quad \dots K$$

$$= \frac{M}{C_0^2 R_0^2}, \quad \dots M = \frac{R_0}{R_c} - 1$$

$$M > 0, R_0 > Rc$$

$$\dots T = {}_2\cdot {}_1 = \sqrt{\frac{K^2}{4 \cdot 0} + K} = \frac{\cdot 0}{2Q_0}\sqrt{M(4Q_0 + M)} \quad \text{(Exp. 3)}$$

T: Unwanted resonance non-angular bandwidth $$\dots Q = \frac{R_0}{{}_0 L_0} = {}_0 C_0 R_0 \dots \quad \text{(Exp. 4)}$$

the (Exp. 1) represents unwanted resonance non-angular bandwidth, (Exp. 2) represents a condition for fulfilling the (Exp. 1), and (Exp. 3) represents an unwanted band, (Exp. 5) is fulfilled, where $$\dots R_L = \frac{r_. \times C - R_c \times D}{A^2 + B^2} \dots X_L \quad \text{(Exp. 5)}$$

$$= \frac{X_. \times C - X_c \times D}{A^2 + B^2} \cdot \dots r_.$$

$$= \frac{R_0 X_0^2}{R_0^2 + X_0^2}, \quad \dots X_. = \frac{X_0 R_0^2}{R_0^2 + X_0^2}, \quad \dots X_0$$

$$= \frac{1}{..C_0\left(\frac{2}{.0^2} - 1\right)}, \quad \dots X_c = \frac{1}{..C_c} \dots A$$

$$= r_. - R_c, \quad \dots B = X_. - X_c, \quad \dots C$$

$$= R_c^2 + X_c^2, \quad \dots D = r_.^2 + X_.^2$$

Q represents parallel resonance angular frequency which is a ratio of a real number to reactance shown by the $\omega_o$ in the (Exp. 4), RL represents the negative resistance for oscillating the series arm consisting of L1/C1/R0 of the oscillator, XL represents reactance, Cc represents circuit capacitance of the oscillation circuit, and ω represents oscillation angular frequency, and (Exp. 5) represents negative resistance and load capacitance for oscillating a series arm consisting of L1/C1/R0 of the oscillator.

According to a sixth aspect of the present invention, there is provided a high-frequency piezoelectric oscillator according to any one of the first, second, third and fourth aspects, wherein the resistance within a range according to the fifth aspect is organized within an inductor, and the inductor having the inductor and the resistor integrated together is connected in parallel to the interelectrode capacitance $C_o$ of the oscillator.

BRIEF DESCRIPTION OF THE DRAWINGS

FIG. 22 illustrates one example of a conventional Colpitts type oscillator;

FIG. 23 illustrates another example of a conventional Colpitts type oscillator;

DETAILED DESCRIPTIONS

High-frequency piezoelectric oscillator according to embodiments of the present invention will be explained in detail below with reference to the accompanying drawings. Unless specified otherwise, the scope of the present invention is not limited to constituent elements, kinds, combinations, shapes, and relative arrangements described in the embodiments. These show only examples.

Figure 1:
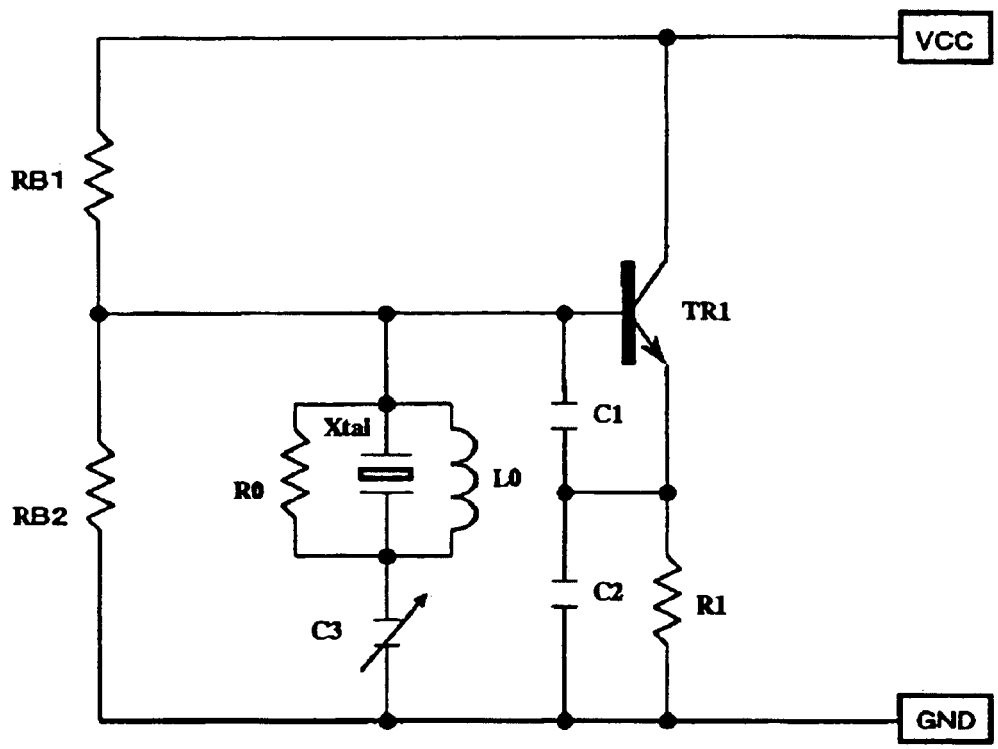
FIG. 1 is a configuration diagram of a first high-frequency piezoelectric oscillator according to the present invention.

FIG. 1 is a configuration diagram of a first high-frequency piezoelectric oscillator according to the present invention. In this high-frequency piezoelectric oscillator, a series circuit of capacitors C1 and C2 as a part of a load capacitance are connected between a base of a transistor TR1 and the ground. The connection point of the capacitors C1 and C2 is connected to an emitter of a transistor TR21, and is grounded via a resistor R1. A base bias circuit consisting of a resistor RB1 and a resistor RB2 is connected to the base of the transistor TR1. A parallel circuit of a piezoelectric vibrator (X'tal), an inductor L0, and a resistor R0 is connected to a capacitor C3, and the parallel circuit is connected to the base of the transistor TR1, and the capacitor is connected to the ground. A collector of the transistor TR1 and a power supply line (Vcc) are connected together.

Figure 2:
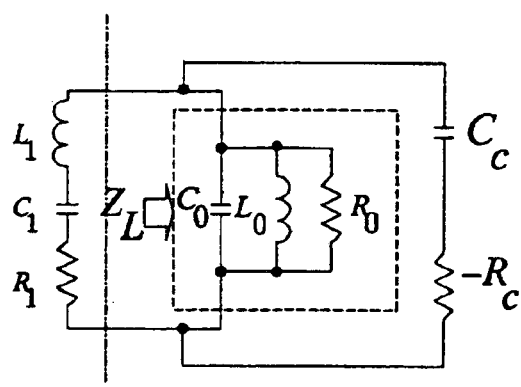
FIG. 2 is a configuration diagram of an equivalent circuit 1 of the first high-frequency piezoelectric oscillator according to the present invention.
Figure 3:
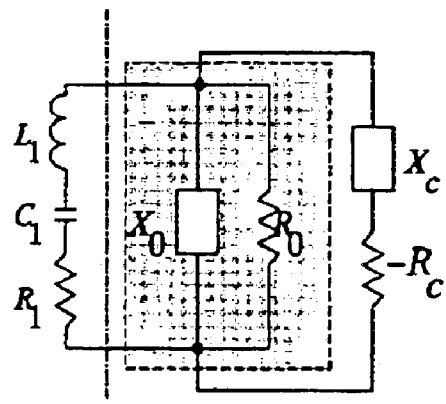
FIG. 3 is a configuration diagram of an equivalent circuit 2 of the first high-frequency piezoelectric oscillator according to the present invention.
Figure 4:
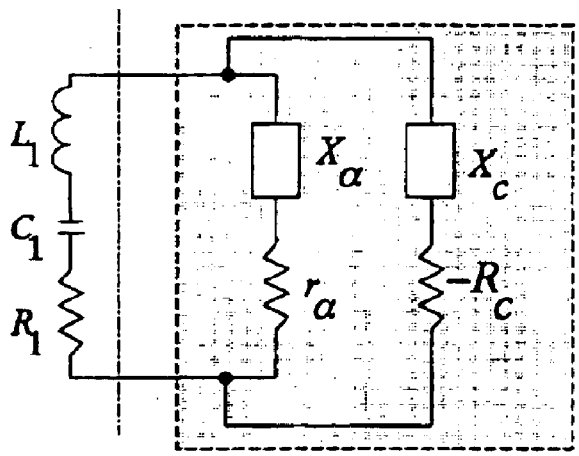
FIG. 4 is a configuration diagram of an equivalent circuit 3 of the first high-frequency piezoelectric oscillator according to the present invention.
Figure 5:
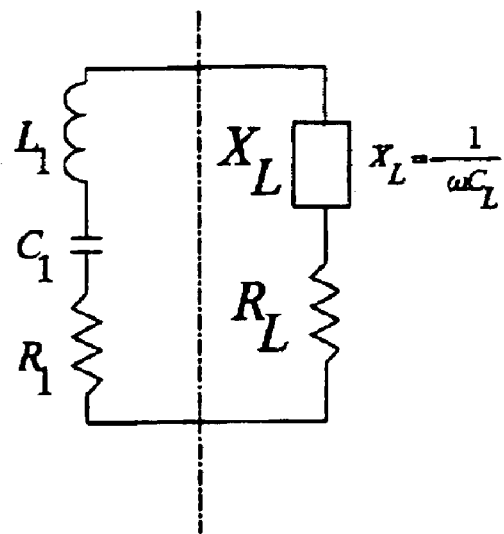
FIG. 5 is a configuration diagram of an equivalent circuit 4 of the first high-frequency piezoelectric oscillator according to the present invention.

FIG. 2 is a configuration diagram of an equivalent circuit 1 of the first high-frequency piezoelectric oscillator, shown in FIG. 1, according to the present invention. C0 represents interelectrode capacitance of the piezoelectric vibrator (X'tal), L1 represents an inductor, C1 represents capacitance, R1 represents resistance, −Rc represents negative resistance of an oscillation circuit, and Cc represents circuit capacitance. FIG. 3 is a configuration diagram of an equivalent circuit 2, where X0 represents reactance of a parallel circuit of the interelectrode capacitance C0 of the piezoelectric vibrator (X'tal) and an inductor L0, and −Xc represents circuit capacitance of the circuit. In this equivalent circuit 2, the reactance X0 and a resistance R0 is connected in parallel. FIG. 4 is a configuration diagram of an equivalent circuit 3, where the parallel circuit of the reactance X0 and the resistance R0 in FIG. 3 is converted to a series circuit of a resistance rα and reactance Xα. In this FIG. 3, −Rc represents negative resistance of the oscillation circuit, and Xc represents circuit capacitance. FIG. 5 shows an equivalent circuit consisting of the negative resistance RL and XL that are converted from the series circuit connected to the piezoelectric vibrator (X'tal) (hereinafter, the series circuit connected to the piezoelectric vibrator is referred to as "series arm"). Exp. (8) shows an oscillation condition of the equivalent circuit shown in FIG. 3.

$$R_1 + R_L = 0 \quad (8)$$

$$\omega L_1 + \frac{1}{\omega \cdot C_1} + X_L = 0$$

The reactance X0 shown in FIG. 3 is obtained, and Exp. (9) is obtained.

$$jX_0 = \frac{\frac{L_0}{C_0}}{j\omega L_0 + \frac{1}{j\omega C_0}}, \quad \ldots \omega_0^2 \quad (9)$$

$$= \frac{1}{L_0 C_0} \ldots \omega_0 = \frac{1}{\sqrt{L_0 C_0}} \ldots$$

$$= \frac{L_0}{C_0} \times \frac{1}{j\omega L_0 \left(1 - \frac{1}{\omega^2 C_0 L_0}\right)}$$

$$= \frac{1}{j\omega C_0} \times \frac{1}{\left(1 - \frac{1}{\omega^2 C_0 L_0}\right)}$$

$$= -j \frac{1}{\omega C_0} \times \frac{1}{\left(1 - \frac{1}{\omega^2 C_0 L_0}\right)} \ldots X_0$$

$$= -\frac{1}{\omega C_0} \times \frac{1}{\left(1 - \frac{\omega_0^2}{\omega^2}\right)} = \frac{1}{\omega C_0} \times \frac{1}{\left(\frac{\omega_0^2}{\omega^2} - 1\right)}$$

The resistance rα and the reactance Xα shown in FIG. 4 are obtained, and Exp. (10) is obtained. The resistance RL and the reactance XL shown in FIG. 5 are obtained, and Exp. (11) is obtained.

$$\ldots z_0 = \frac{jX_0 \times R_0}{R_0 + jX_0} = \frac{jX_0 \times R_0(R_0 - jX_0)}{R_0^2 + X_0^2} \quad (10)$$

$$= \frac{X_0 \times R_0(X_0 + jR_0)}{R_0^2 + X_0^2} = \frac{R_0 X_0^2}{R_0^2 + X_0^2} + j\frac{X_0 R_0^2}{R_0^2 + X_0^2} \ldots r_\alpha$$

$$= \frac{R_0 X_0^2}{R_0^2 + X_0^2}, \quad \ldots X_\alpha = \frac{X_0 R_0^2}{R_0^2 + X_0^2}$$

$$\ldots Z_L = \frac{(r_\alpha + jX_\alpha)(-R_c - jX_c)}{r_\alpha + jX_\alpha - R_c - jX_c} \ldots \quad (11)$$

$$= \frac{-r_\alpha R_c + X_\alpha X_c - j(X_\alpha R_c + X_c r_\alpha)}{r_\alpha - R_c + j(X_\alpha - X_c)}, \quad \ldots A$$

$$= r_\alpha - R_c, \quad \ldots B = X_\alpha - X_c, \quad \ldots C$$

$$= R_c^2 + X_c^2, \quad \ldots D = r_\alpha^2 + X_\alpha^2 \ldots R_L$$

$$= \frac{r_\alpha \times C - R_c \times D}{A^2 + B^2}, \quad \ldots X_L = \frac{X_c \times D - X_\alpha \times C}{A^2 + B^2}$$

Figure 6:
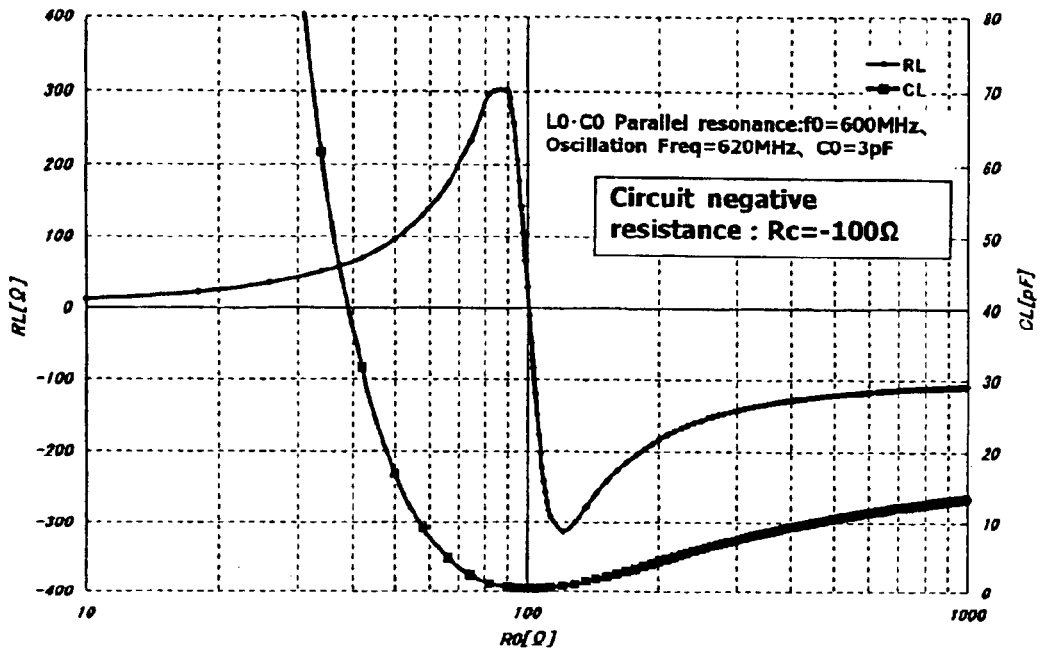
FIG. 6 illustrates a relationship between load resistance RL, circuit negative resistance Rc, oscillator parallel capacitance, and parallel additional resistance R0 to an inductance L0 according to the present invention.

FIG. 6 illustrates a relationship between the resistance R0 and the load resistance RL, and a relationship between the resistance R0 and the capacitance CL obtained from the Exps. (10) and (11). The left side of the axis of an ordinate represents the load resistance RL, the right side of the axis of an ordinate represents the capacitance CL, and the axis of an abscissa represents the parallel resistance R0. From FIG. 6, it is clear from the variation of the load resistance RL that connects to the series arm, there is an optimum value for the parallel resistance R0. In other words, it is clear that the load resistance RL is stable when the parallel resistance R0 is approximately 200Ω. The parallel resonance frequency of the L0 and C0 is 600 MHz, the oscillation frequency is 620 MHz, and C0=3 pF.

Figure 7:
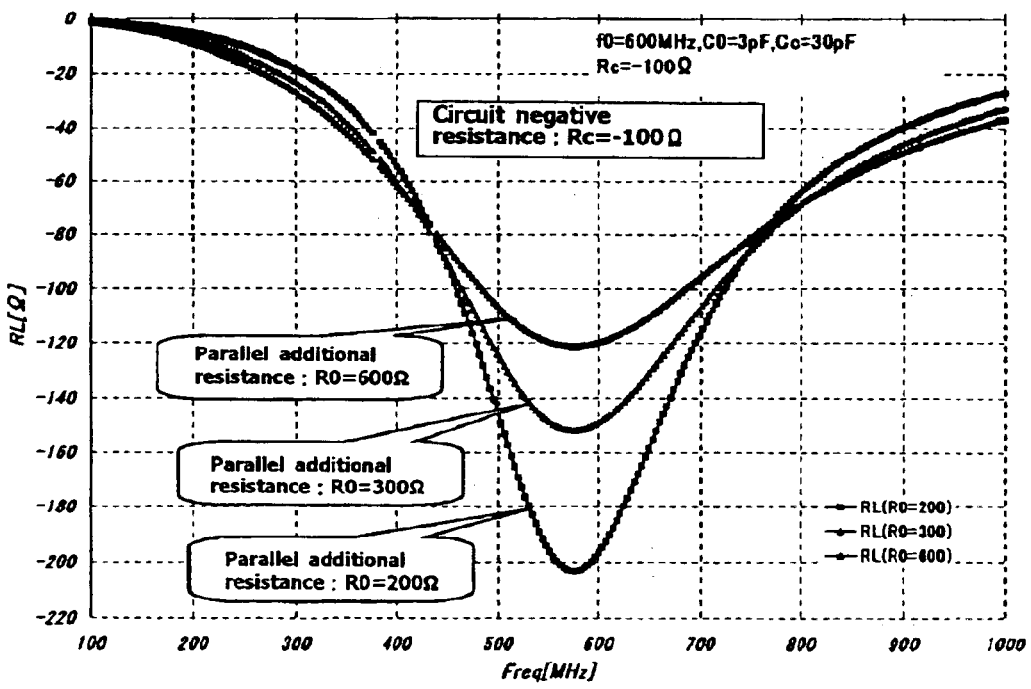
FIG. 7 illustrates a relationship between the parallel additional resistance R0 and the load resistance RL connected to a series arm according to the present invention.

FIG. 7 illustrates a relationship between the load resistance RL connected to the series arm and the oscillation frequency depending on the parallel resistance R0 (200Ω, 300Ω, and 600Ω). The ordinate represents the load resistance RL, and the abscissa represents frequency. From FIG. 7, it is clear that when the parallel resistance R0 increases, the load resistance RL of the series arm. The parallel resonance frequency of the L0 and C0 is 600 MHz, C0=3 pF, and Ce=30 pF.

Figure 8:
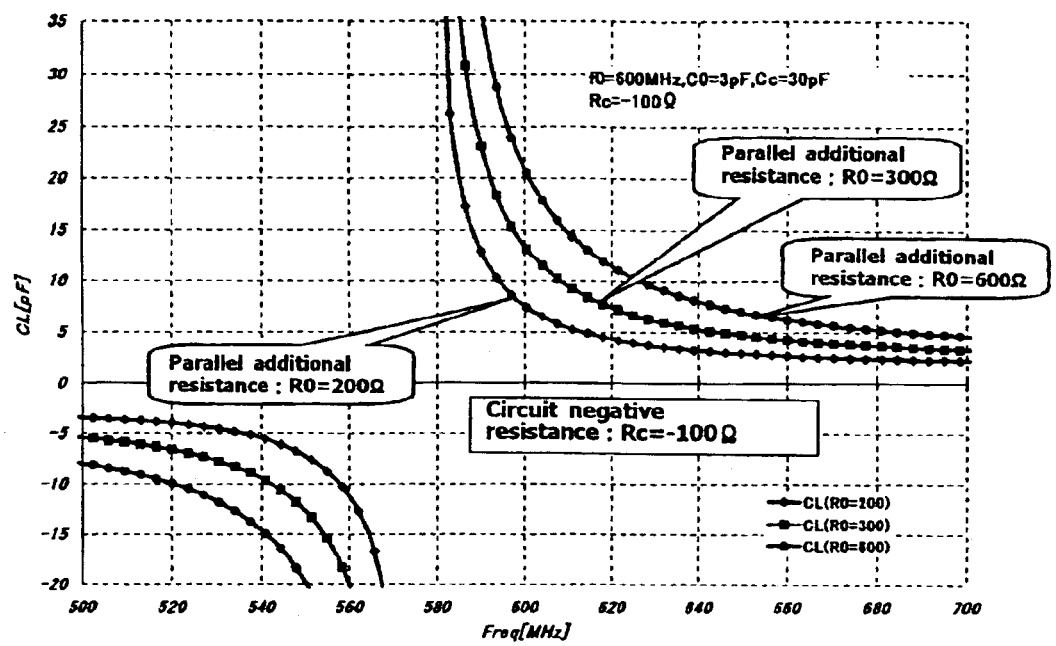
FIG. 8 illustrates a relationship between load capacitance CL and frequency.

FIG. 8 illustrates a relationship between the load capacitance CL and frequency. The ordinate represents the load capacitance CL, and the abscissa represents frequency. From FIG. 8, it is clear that the circuit capacitance CL is capacitive at 580 MHz or above when the parallel resonance frequency f0 defined by the L0 and Co is 600 MHz.

Figure 9:
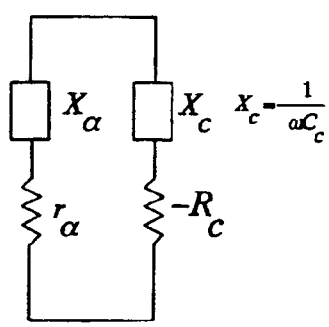
FIG. 9 is a configuration diagram of an equivalent circuit that shows unwanted oscillation of the first high-frequency piezoelectric oscillator according to the present invention.

FIG. 9 is an equivalent circuit of the present invention shown in FIG. 1 under the condition of an unwanted oscillation state. Exp. (12) represents a condition that the circuit does not oscillate. Exp. (13) represents a condition that the circuit can oscillate. Exp. (14) represents an oscillation frequency condition.

$$r_\alpha - R_c > 0 \quad (12)$$

$$r_\alpha - R_c < 0 \quad (13)$$

$$X_\alpha - X_c = 0 \quad (14)$$

Figure 10:
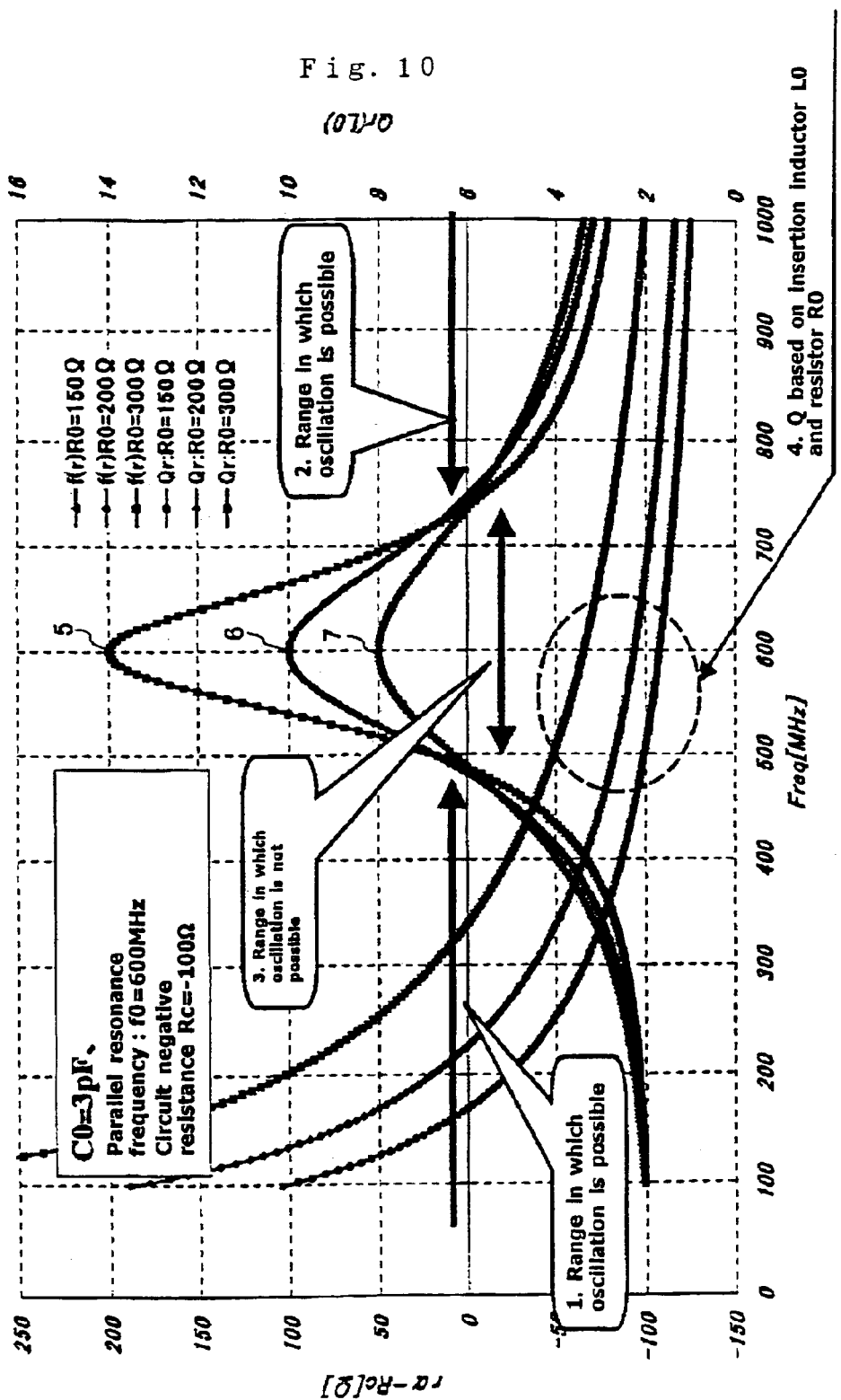
FIG. 10 illustrates an unwanted oscillation region of the first high-frequency piezoelectric oscillator according to the present invention.

FIG. 10 illustrates an unwanted oscillation region of the circuit, shown in FIG. 1, according to the present invention. The ordinate represents rα−Rc, and the abscissa represents frequency. From FIG. 10, it is clear that in the frequency region from about 480 MHz to 750 MHz, the series resistance rα that occurs based on the resistance R0 parallel connected to the oscillator becomes larger than the negative resistance Rc that occurs from the circuit. As this state fulfills the Exp. (12), this region becomes an oscillation impossible region 3. As is clear from the characteristics curves 5 and 6, this region is constant regardless of R0. In other regions 1 and 2, oscillation is possible. However, Qr due to the inductor L0 and the resistance R0 becomes as shown in FIG. 10.

Figure 11:
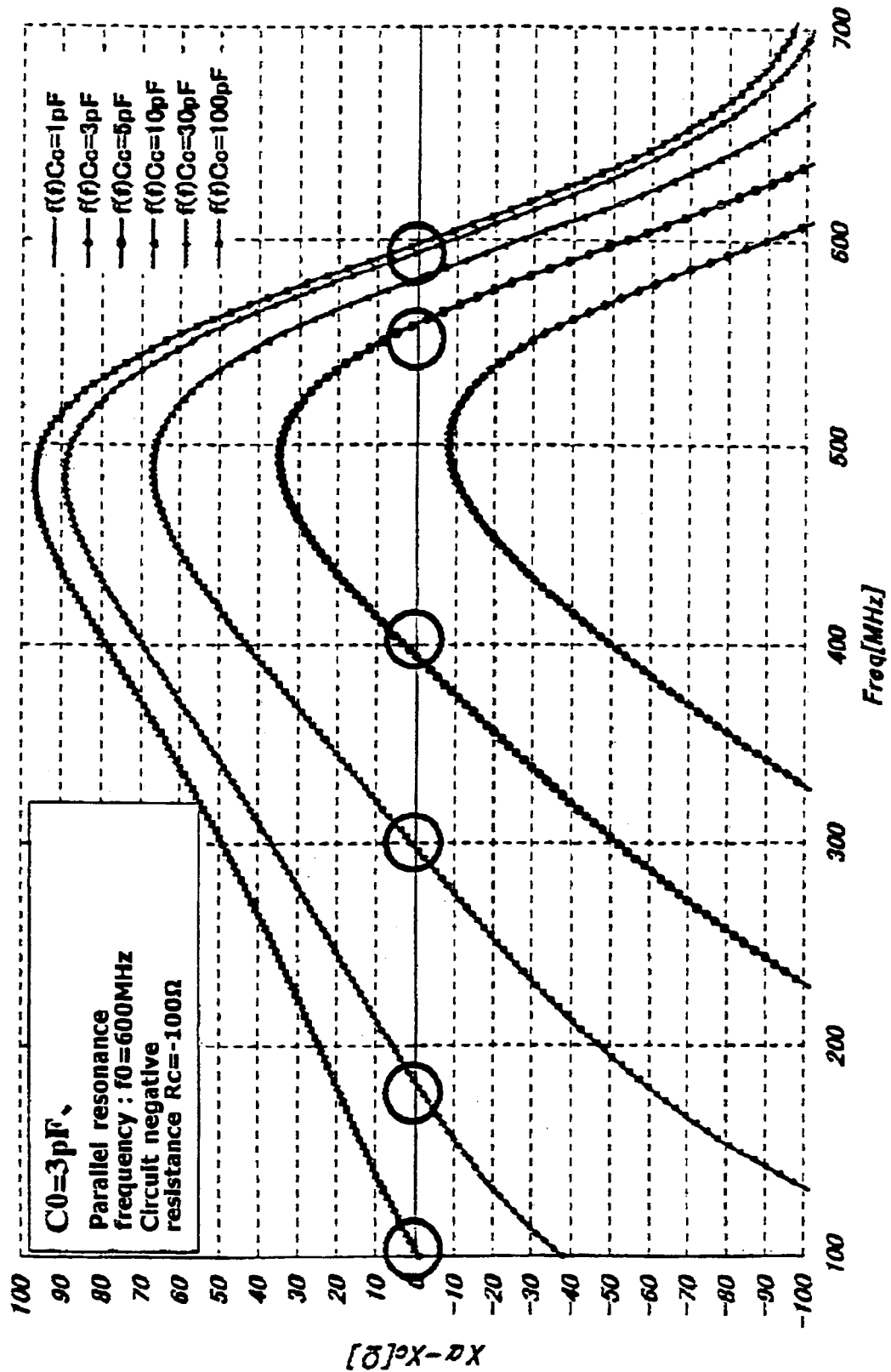
FIG. 11 is a graph of unwanted resonance frequency according to the present invention.
Figure 25:
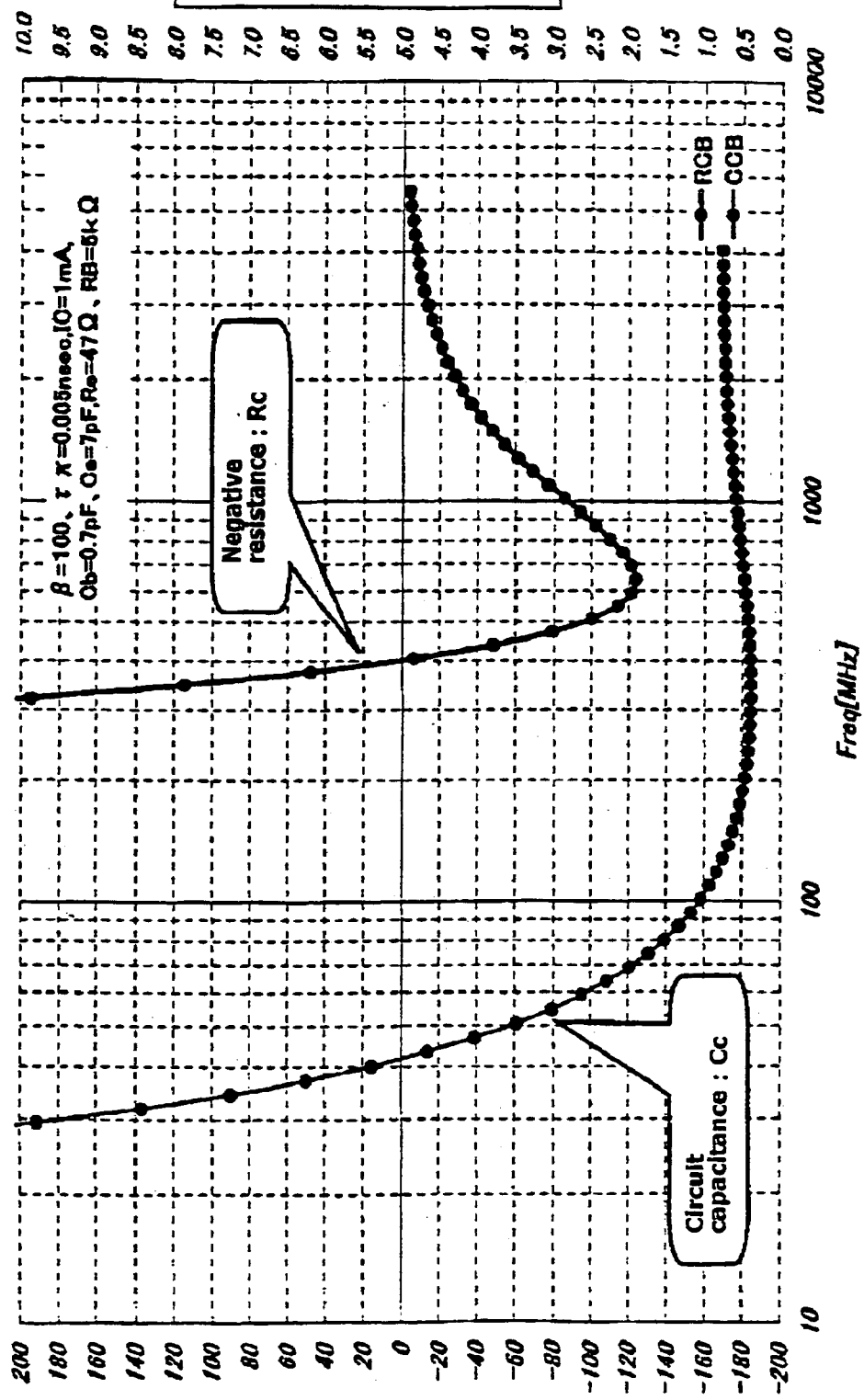
FIG. 25 illustrates a result of carrying out a simulation about characteristics of negative resistance Rc and circuit capacitance Cc of a representative Colpitts oscillation circuit.
Figure 26:
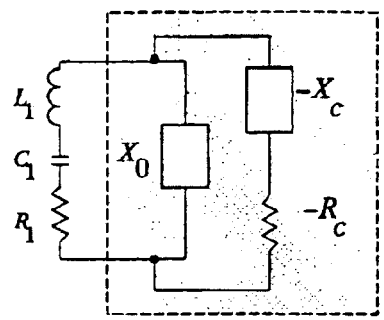
FIG. 26 illustrates X0 that represents reactance of a parallel resonance circuit of the parallel capacitance C0 and the inductor L0 of the oscillator of the equivalent circuit shown in FIG. 24.
Figure 27:
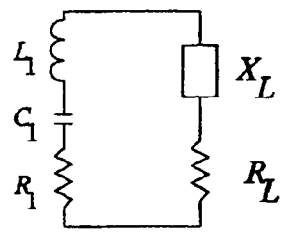
FIG. 27 illustrates X0 that represents reactance of a parallel resonance circuit of the parallel capacitance C0 and the inductor L0 of the oscillator of the equivalent circuit shown in FIG. 24.
Figure 28:
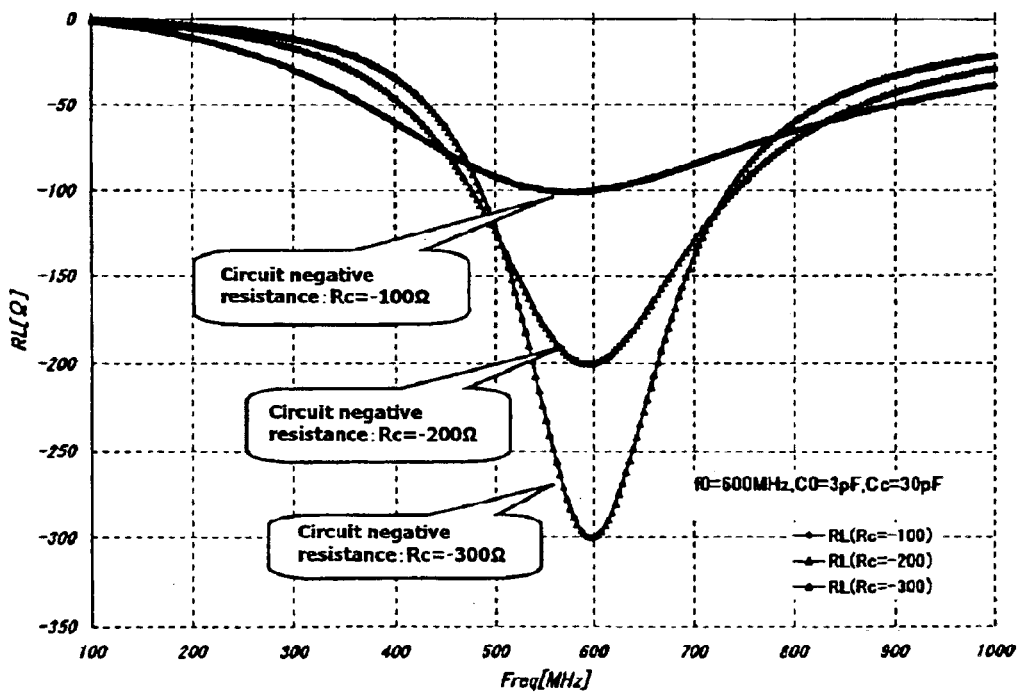
FIG. 28 illustrates characteristics of series arm load resistance RL based on the diagram shown in FIG. 27.
Figure 29:
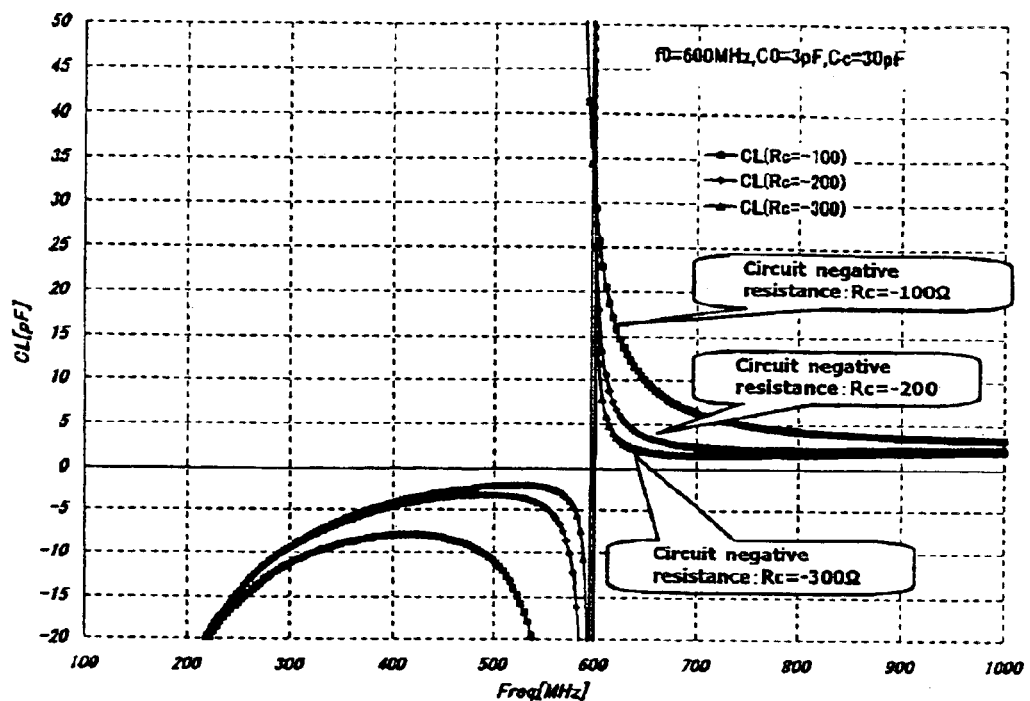
FIG. 29 illustrates a relationship between series arm load capacitance and frequency based on the diagram shown in FIG. 27.
Figure 30:
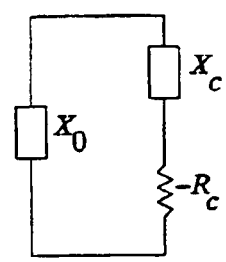
FIG. 30 illustrates an unwanted resonance loop.
Figure 31:
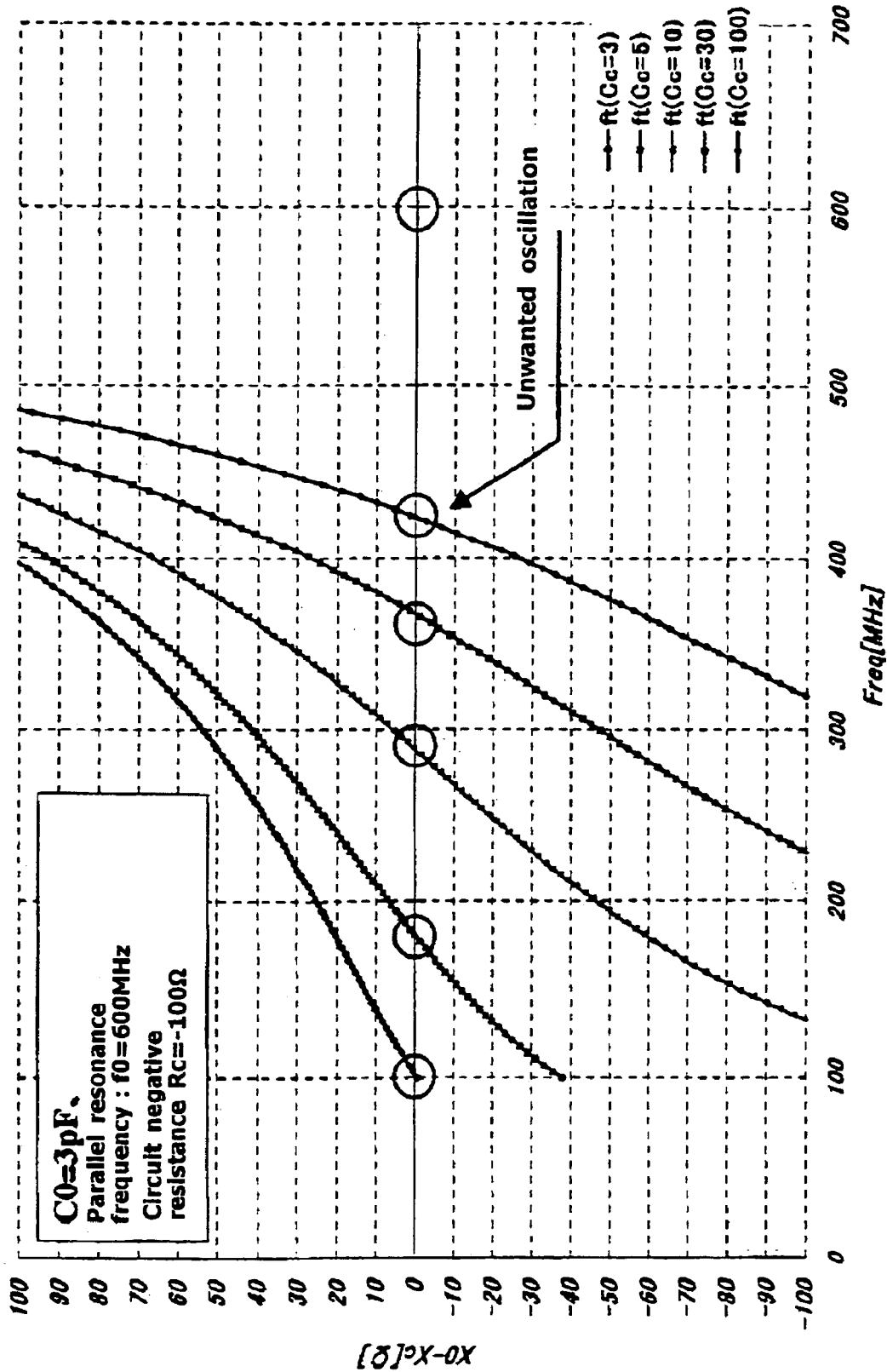
FIG. 31 illustrates unwanted resonance frequency.
Figure 32:
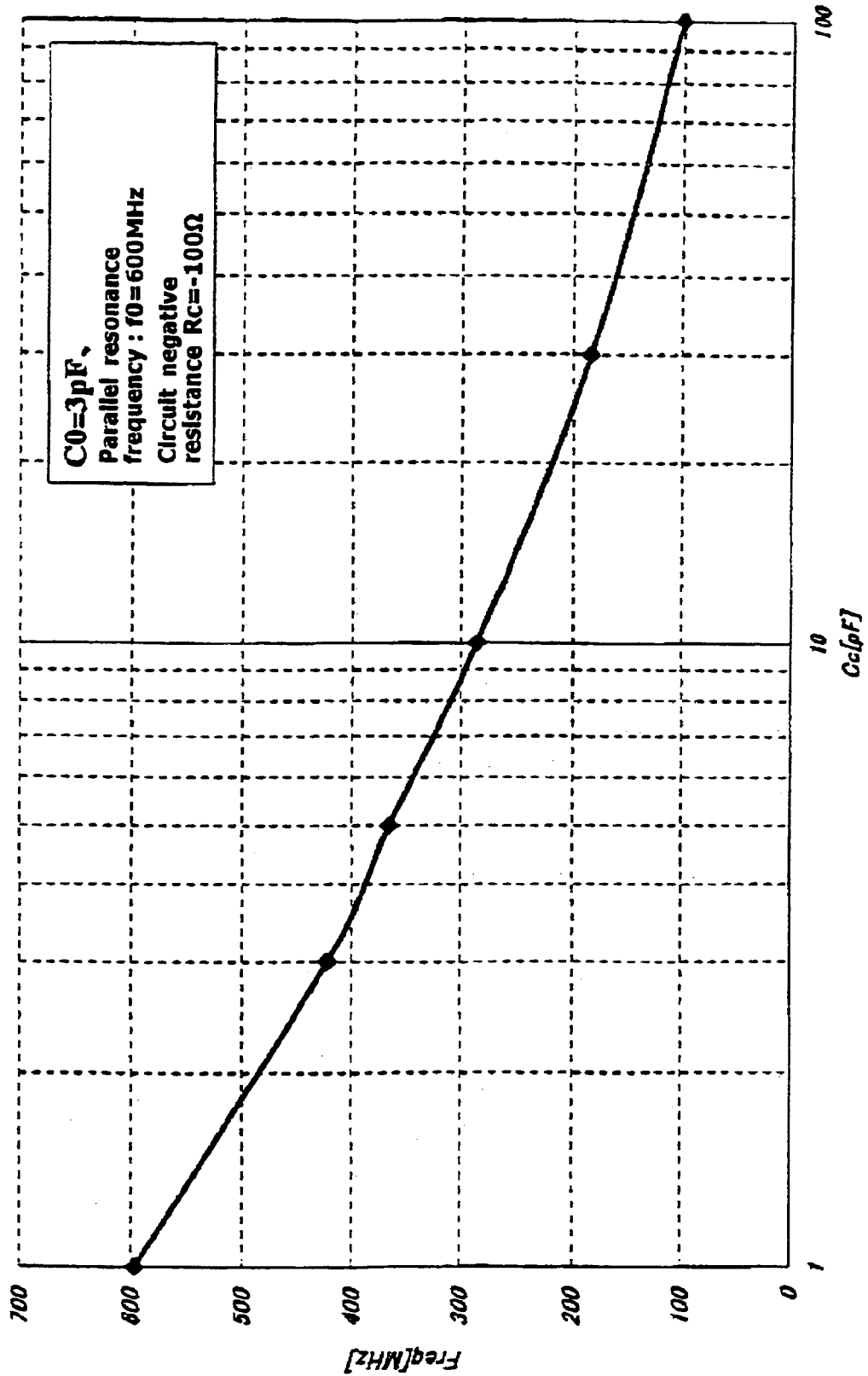
FIG. 32 illustrates a relationship between unwanted resonance frequency and circuit capacitance.

FIG. 11 represents a relationship between unwanted resonance frequency ft and resistance Xα−Xc when Cc=1, 3, 5, 10, 30, and 100 pF respectively in a condition that C0=3 pF, the parallel resonance frequency is f0=600 MHz, and the circuit negative resistance Rc=−100Ω. The frequency when Xα−Xc=0 on each characteristic curve is unwanted resonance frequency. From FIG. 11, it is clear that the unwanted resonance frequency is present in the frequency lower than 600 MHz. However, in the frequency of 480 MHz or above, the oscillator cannot oscillate as is clear from FIG. 10. In the frequency not higher than 400 MHz, the negative resistance of the Colpitts oscillation circuit shown in FIG. 25 does not occur, and therefore, the oscillator cannot oscillate.

Figure 12:
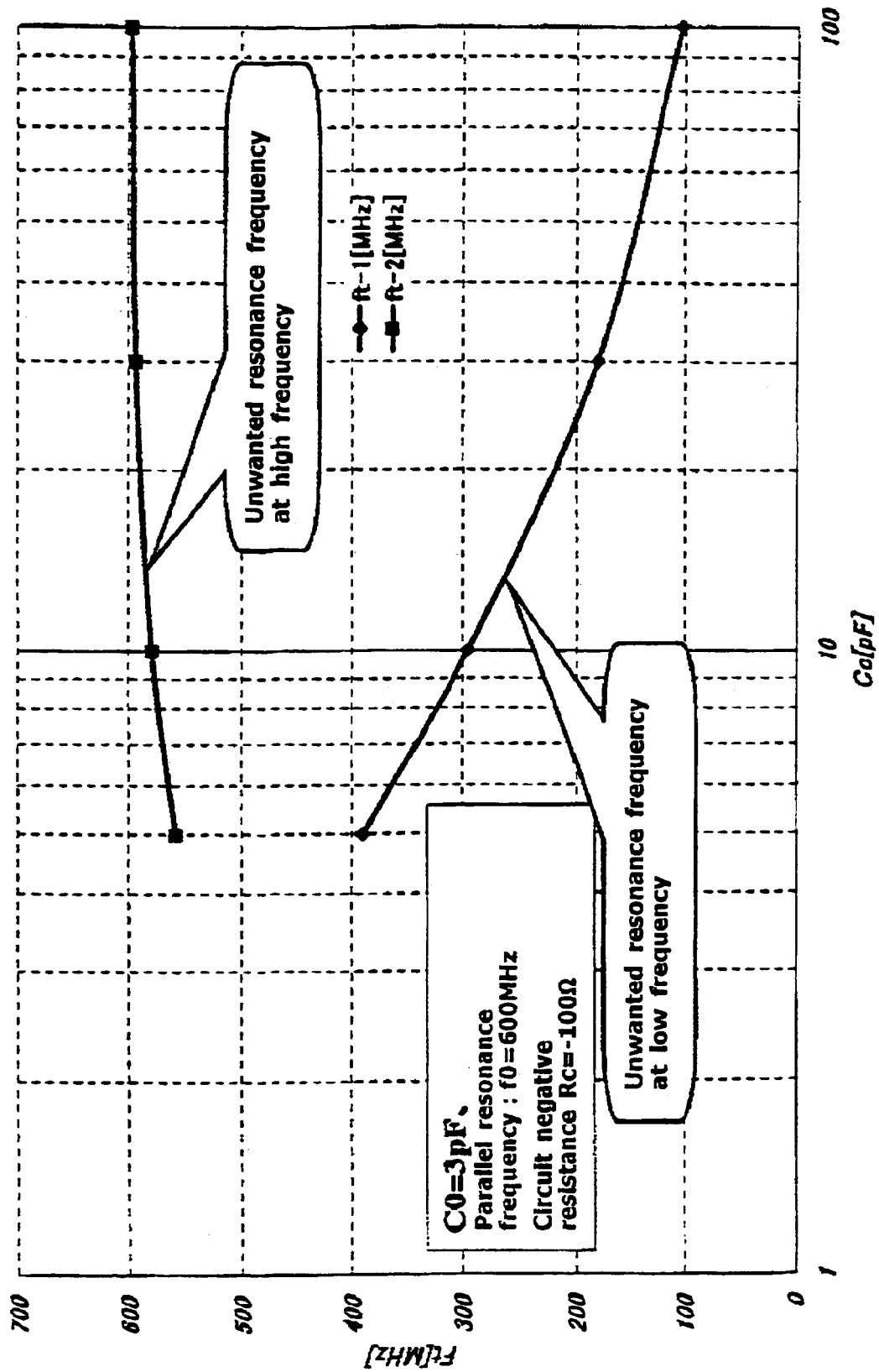
FIG. 12 illustrates a relationship between unwanted resonance frequency and circuit capacitance.

FIG. 12 illustrates a relationship between unwanted resonance frequency and circuit capacitance. The ordinate represents unwanted resonance frequency, and the abscissa represents circuit capacitance. From FIG. 12, it is clear that when Cc is 5 pF or above, low frequency unwanted resonance occurs in the frequency 400 MHz or below, and high frequency unwanted resonance occurs in the frequency 580 MHz or above.

As explained above, according to the circuit of the present invention shown in FIG. 1, it is made clear by the simulation that the increase in the negative resistance and unwanted oscillation can be prevented, by connecting the inductor L0 to the parallel capacitance C0 of the oscillator and by connecting proper resistance R0 in parallel.

A frequency band in which unwanted resonance does not occur is obtained next.

This operation is the same as obtaining a range in which an absolute value $|R_c|$ of the negative resistance of the circuit is smaller than series resistance $r_\alpha$.

Conditions for not generating unwanted resonance are obtained from the Exp. (10), the Exp. (4), and the Exp. (12).

$$\ldots r_\alpha = \frac{R_0 \times X_0^2}{R_0^2 + X_0^2}, \ldots X_0 = \frac{1}{\omega C_0\left(\frac{\omega_0^2}{\omega^2} - 1\right)} \ldots r_\alpha - R_c > 0 \quad (15)$$

$$\ldots \frac{R_0 X_0^2}{R_0^2 + X_0^2} - R_c > 0 \ldots \rightarrow \ldots \frac{1}{X_0^2} < \frac{1}{R_0^2}\left(\frac{R_0}{R_c} - 1\right)$$

$$\ldots \omega^2 C_0^2 \left(\frac{\omega_0^2}{\omega^2} - 1\right)^2 < \frac{1}{R_0^2}\left(\frac{R_0}{R_c} - 1\right) \ldots \rightarrow$$

$$\ldots \omega^2 \left(\frac{\omega_0^2}{\omega^2} - 1\right)^2 < \frac{1}{C_0^2 R_0^2}\left(\frac{R_0}{R_c} - 1\right),$$

$$\ldots \Theta K = \frac{M}{C_0^2 R_0^2}, \ldots M = \left(\frac{R_0}{R_c} - 1\right)$$

$$\ldots \omega^2\left(\frac{\omega_0^2}{\omega^2} - 1\right)^2 < K \ldots \rightarrow \quad (16)$$

$$\frac{\omega_0^4}{\omega^2} - 2\omega_0^2 + \omega^2 < K \ldots \rightarrow \ldots \omega^4 - (2\omega_0^2 + K)\omega^2 + \omega_0^4 < 0$$

$$\int(\omega^2) = \omega^4 - (2\omega_0^2 + K)\omega^2 + \omega_0^4 \quad (17)$$

From the Exp. (17), a root is obtained by setting $f(\omega^2)=0$.

$$\ldots \omega^2 = \omega_0^2 + \frac{K}{2} \pm \frac{\sqrt{K(K+4\omega_0^2)}}{2} = \omega_0^2 + \frac{K \pm \sqrt{K(K+4\omega_0^2)}}{2} \quad (18)$$

$$\ldots \omega_1^2 = \omega_0^2 + \frac{K - \sqrt{K(K+4\omega_0^2)}}{2}, \ldots \omega_1 \quad (19)$$

$$= \sqrt{\omega_0^2 + \frac{K - \sqrt{K(K+4\omega_0^2)}}{2}}$$

$$\ldots \omega_2^2 = \omega_0^2 + \frac{K + \sqrt{K(K+4\omega_0^2)}}{2}, \ldots \omega_2 \quad (20)$$

$$= \sqrt{\omega_0^2 + \frac{K + \sqrt{K(K+4\omega_0^2)}}{2}}$$

$$\omega_1 < \omega_T < \omega_2 \quad (21)$$

The bandwidth is obtained.

$$\ldots \omega_2^2 - \omega_1^2 = (\omega_2 - \omega_1)(\omega_2 + \omega_1) = \sqrt{K(K+4\omega_0^2)}, \quad (22)$$

$$\ldots \omega_2 + \omega_1 = 2\omega_0$$

From the Exp. (22), the bandwidth is set to $\Delta\omega T$, and Exp. (23) is obtained.

$$\ldots \Delta\omega_T = \omega_2 - \omega_1 = \frac{\sqrt{K(K+4\omega_0^2)}}{2\omega_0} = \sqrt{\frac{K^2}{4\omega_0^2} + K} \quad (23)$$

Q when the parallel resonance frequency of $C_0/L_0/R_0$ is $\omega_0$ is obtained from Exp. (24).

$$Q = \frac{R_0}{\omega_0 L_0} = \omega_0 C_0 R_0 \quad (24)$$

The Exp. (24) is substituted into Exp. (15) to obtain Exp. (25).

$$\ldots K = \frac{M}{C_0^2 R_0^2} = \frac{\omega_0^2 M}{Q^2}, \ldots M = \frac{R_0}{R_c} - 1 \quad (25)$$

$$\ldots (\Delta\omega_T)^2 = \frac{1}{4\omega_0^2} \times \frac{\omega_0^4}{Q^4}M^2 + \frac{\omega_0^2}{Q^2}M. = \frac{\omega_0^2}{Q^2}M\left\{1 + \frac{1}{4\omega_0^2} \times \frac{\omega_0^2}{Q^2}M\right\}$$

$$\ldots = \frac{\omega_0^2}{Q^2}M\left\{1 + \frac{1}{4} + \frac{1}{Q^2}M\right\} = \frac{\omega_0^2}{Q^2}M\frac{4Q^2 + M}{4Q^2} = \frac{\omega_0^2}{4Q^4}M\{Q^2 + M\}$$

$$\ldots \Delta\omega_T = \frac{\omega_0}{2Q^2}\sqrt{M(4Q^2 + M)} \quad (26)$$

Exp. (26) shows the unwanted resonance non-angular bandwidth using Q.

Figure 13:
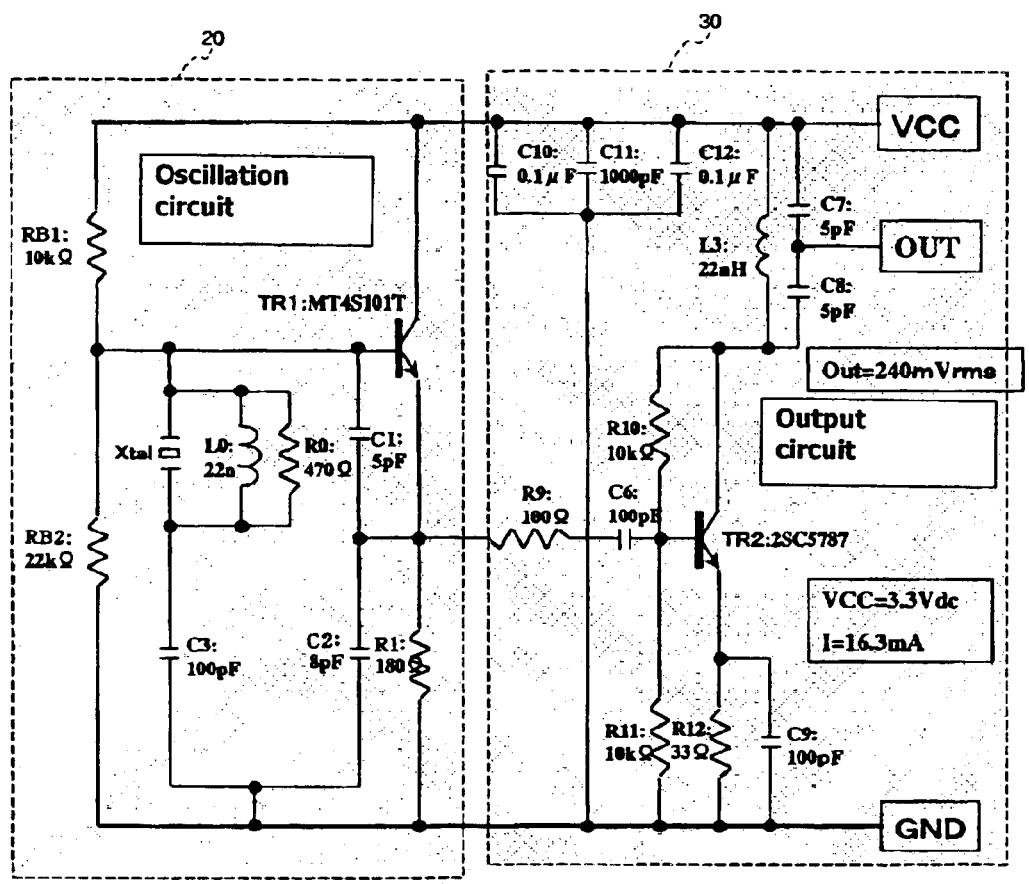
FIG. 13 is a circuit diagram of a high-frequency piezoelectric oscillator according to the first embodiment of the present invention.

FIG. 13 is a circuit diagram of a high-frequency piezoelectric oscillator according to the first embodiment of the present invention. This high-frequency piezoelectric oscillator comprises an oscillation circuit 20 and an output circuit 30. The output circuit 30 is not a main portion of the present invention, and therefore, its explanation will be omitted. Only the oscillation circuit 20 will be explained. Capacitors C1 and C2 that become a part of the load capacitance are connected between the base of the transistor TR1 and the ground. The connection point of the capacitors C1 and C2 is connected to an emitter of the transistor TR1, and is grounded via the emitter resistance R1. A base bias circuit consisting of the resistor RB1 and the resistor RB2 is connected to the base of the transistor TR1. The piezoelectric vibrator (X'tal), the inductor L0, and the resistor R0 are connected in parallel, and the parallel circuit is connected between the base of the transistor TR1 and a capacitor C3. The capacitor C3 is grounded. Further, the collector of the transistor TR1 and the power supply line (Vcc) are connected.

In the present invention, the TR1 is MT4S101T, C1=5 pF, C2=8 pF, C3=100 pF, R1=180Ω, RB1=10 KΩ, and RB2=22 KΩ. As parameters of the piezoelectric vibrator (X'tal), the interelectrode capacitance of the oscillator is C0=3.5 pF, and the capacitance ratio is C0/C1=451. Figure. rate merit that represents a good level of the oscillator is M=1.39 (no oscillation occurs in the inductive region when M<2). The parallel connection inductor L0=22 nH, and Q=20. Based on Q=20, resistance that floats in the inductor is about 1500Ω, and the parallel connection resistance is R0=470Ω. From this, the inductor parallel resistance becomes 1500Ω// 470Ω=360Ω, and the resonance frequency of the oscillator X'tal becomes 600 MHz.

Figure 14:
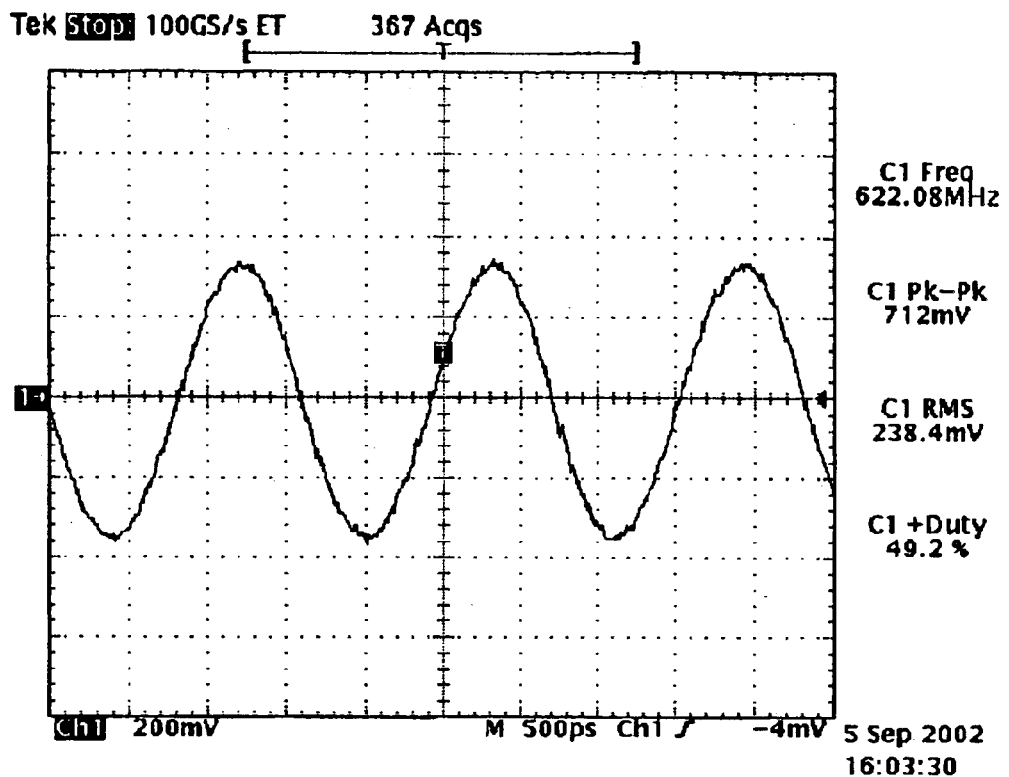
FIG. 14 is a waveform diagram of an oscillation circuit according to the present invention.

FIG. 14 is a waveform diagram of the oscillation circuit 20 according to the present invention. From FIG. 14, it is clear that the frequency is stable in about 600 MHz, and the waveform has small distortion.

Figure 15:
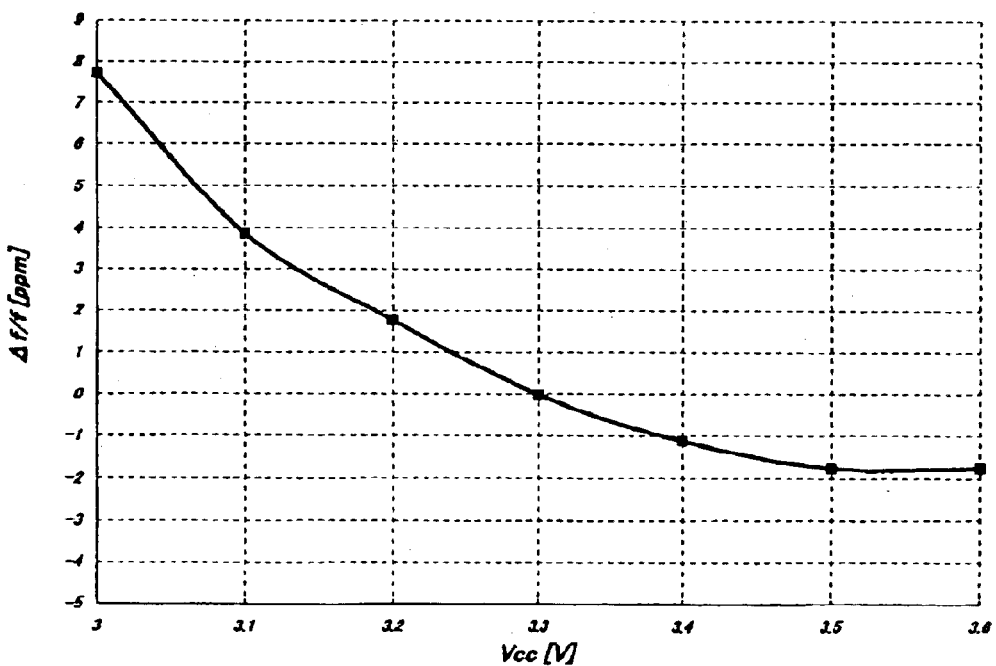
FIG. 15 illustrates power supply variation characteristics of the oscillation circuit according to the present invention.

FIG. 15 illustrates power supply variation characteristics of the oscillation circuit 20 according to the present invention. From FIG. 15, it is confirmed that no abnormal oscillation occurs due to variation in the power supply and frequency. It is also confirmed that the oscillation is from the oscillator and is not unwanted oscillation, from the stable level of the oscillation (±2 ppm @±5% VCC or below). Therefore, it is clear from the result that the oscillation is the oscillator oscillation.

Figure 16:
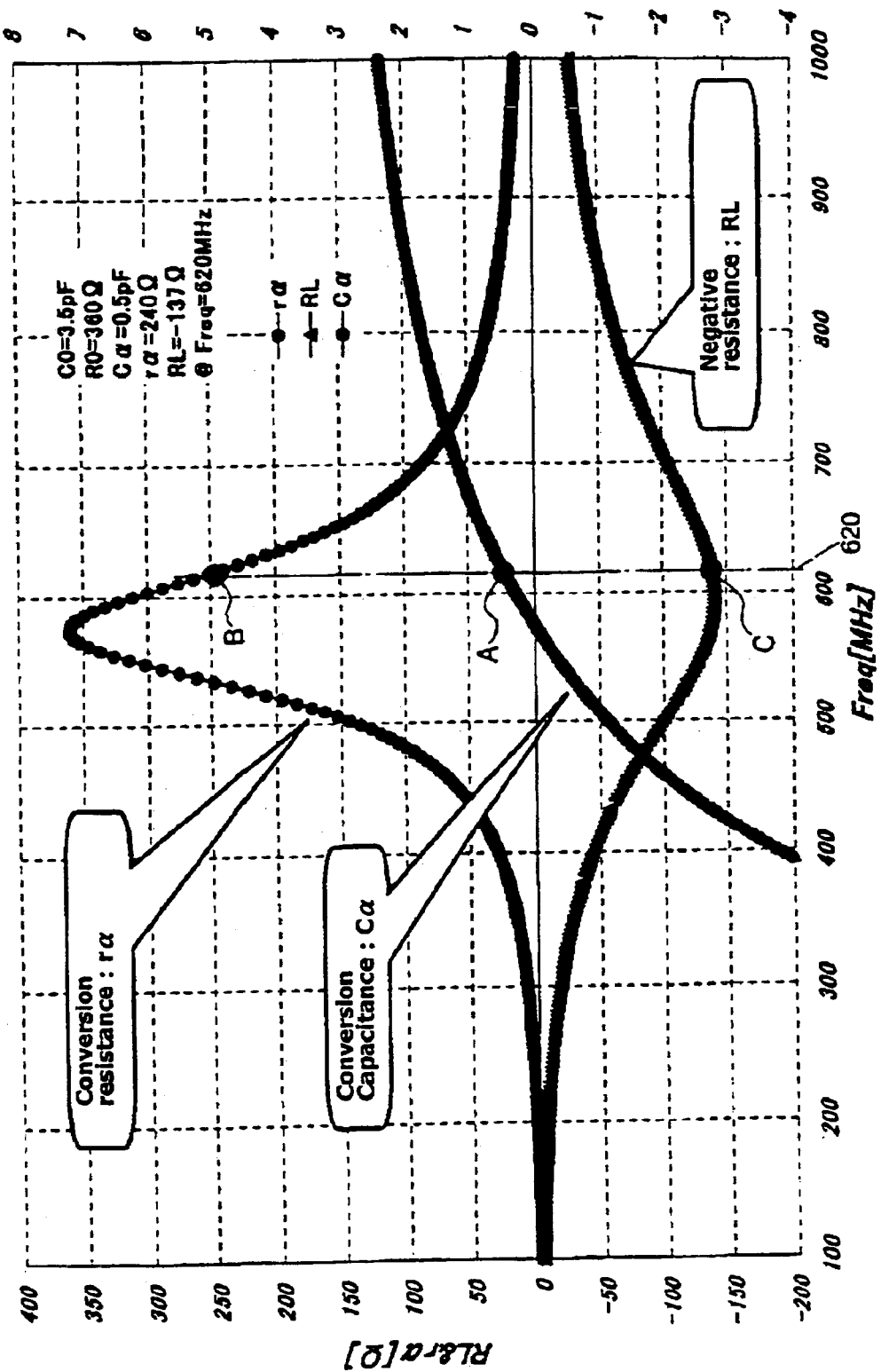
FIG. 16 illustrates a result of a simulation carried out using the oscillation circuit according to the present invention.

FIG. 16 illustrates a result of a simulation carried out using the oscillation circuit 20 when the parallel capacitance of the oscillator is C0=3.5 pF, the parallel connection inductor is L0=22 nH, and the parallel connection resistance is R0=470Ω. From this result, it is clear that when the frequency is 620 MHz, the conversion capacitance is Cα=0.5 pF, the conversion resistance rα=240Ω, and the negative resistance is RL=−137Ω. In other words, it is clear that the present invention is a very effective method to solve the problem of the increase in the interelectrode capacitance of the oscillator and the reduction in the "Figure of Merit" when the oscillator is in high frequency.

Figure 17:
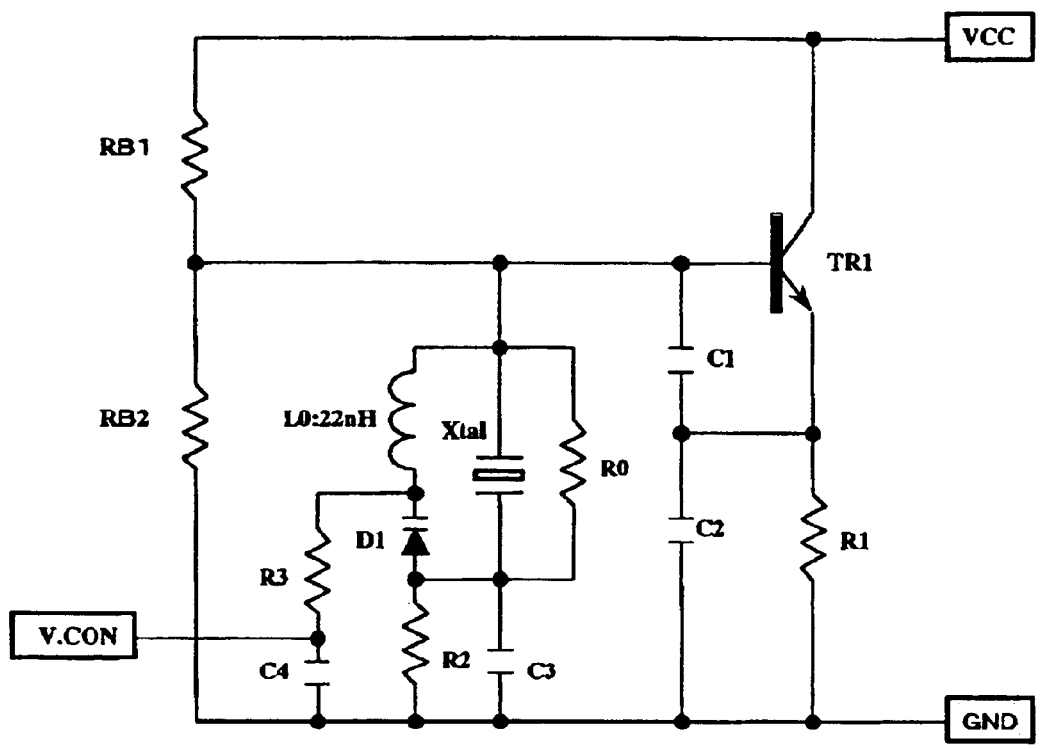
FIG. 17 is a circuit diagram of a high-frequency piezoelectric oscillator according to the second embodiment of the present invention.

FIG. 17 is a circuit diagram of a high-frequency piezoelectric oscillator according to the second embodiment of the present invention. As like constituent elements are designated with like reference numerals, a redundant explanation will be omitted. The configuration shown in FIG. 17 is different from that shown in FIG. 1 in that a variable capacitance diode D1 is inserted in series into the inductor L0, and peripheral circuits R2, R3, and C4 are added. With this arrangement, a voltage is applied to a V.CON terminal to make the capacitance of the inductor L0 variable, thereby to optimize the oscillation and make it possible to control frequency.

Figure 18:
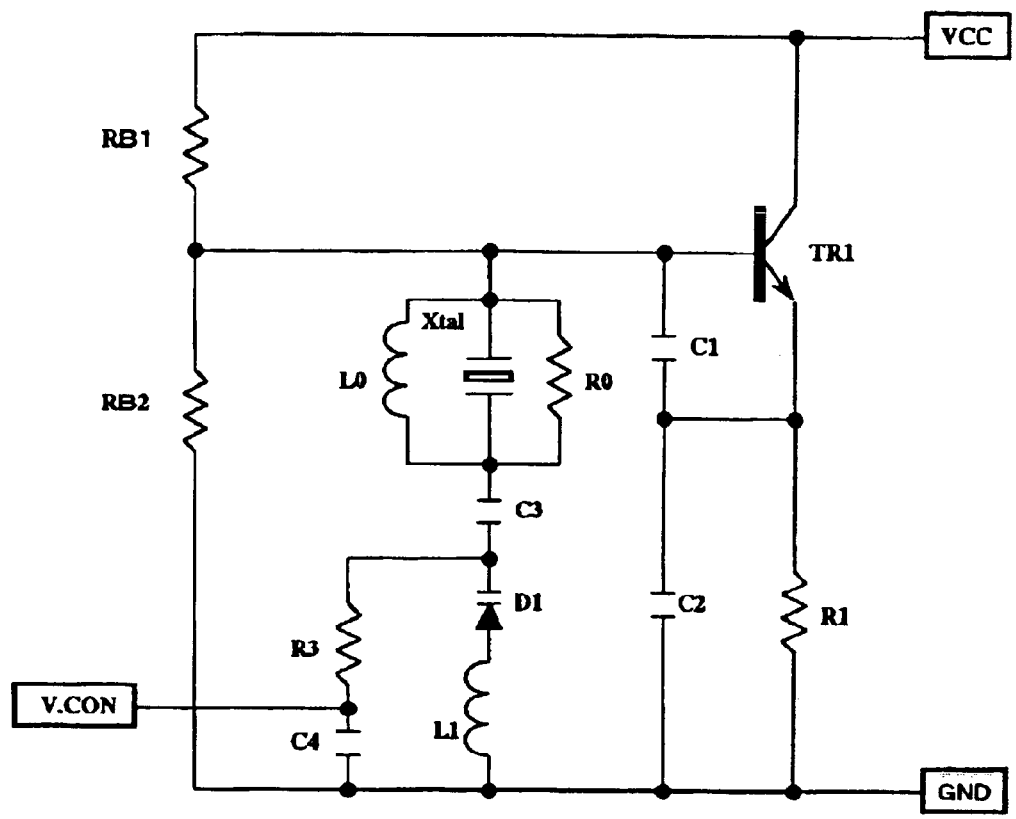
FIG. 18 is a circuit diagram of a high-frequency piezoelectric oscillator according to the third embodiment of the present invention.

FIG. 18 is a circuit diagram of a high-frequency piezoelectric oscillator according to the third embodiment of the present invention. As like constituent elements are designated with like reference numerals, a redundant explanation will be omitted. The configuration shown in FIG. 18 is different from that shown in FIG. 1 in that the variable capacitance diode D1 and an inductor L1 is inserted in series into the capacitor C3, and the peripheral circuits R3 and C4 are added. With this arrangement, a voltage is applied to the V.CON terminal to make the capacitance of the inductor L0 variable, thereby to optimize the oscillation and make it possible to control frequency.

While the present invention is explained above using the oscillation circuit having the fundamental frequency of the oscillator as the oscillation frequency, the present invention is not limited to this arrangement. It is also possible to apply the invention to an oscillation circuit having overtone frequency of third order, fifth order, a seventh order, or a higher order of the oscillator as oscillation frequency.

Figure 19:
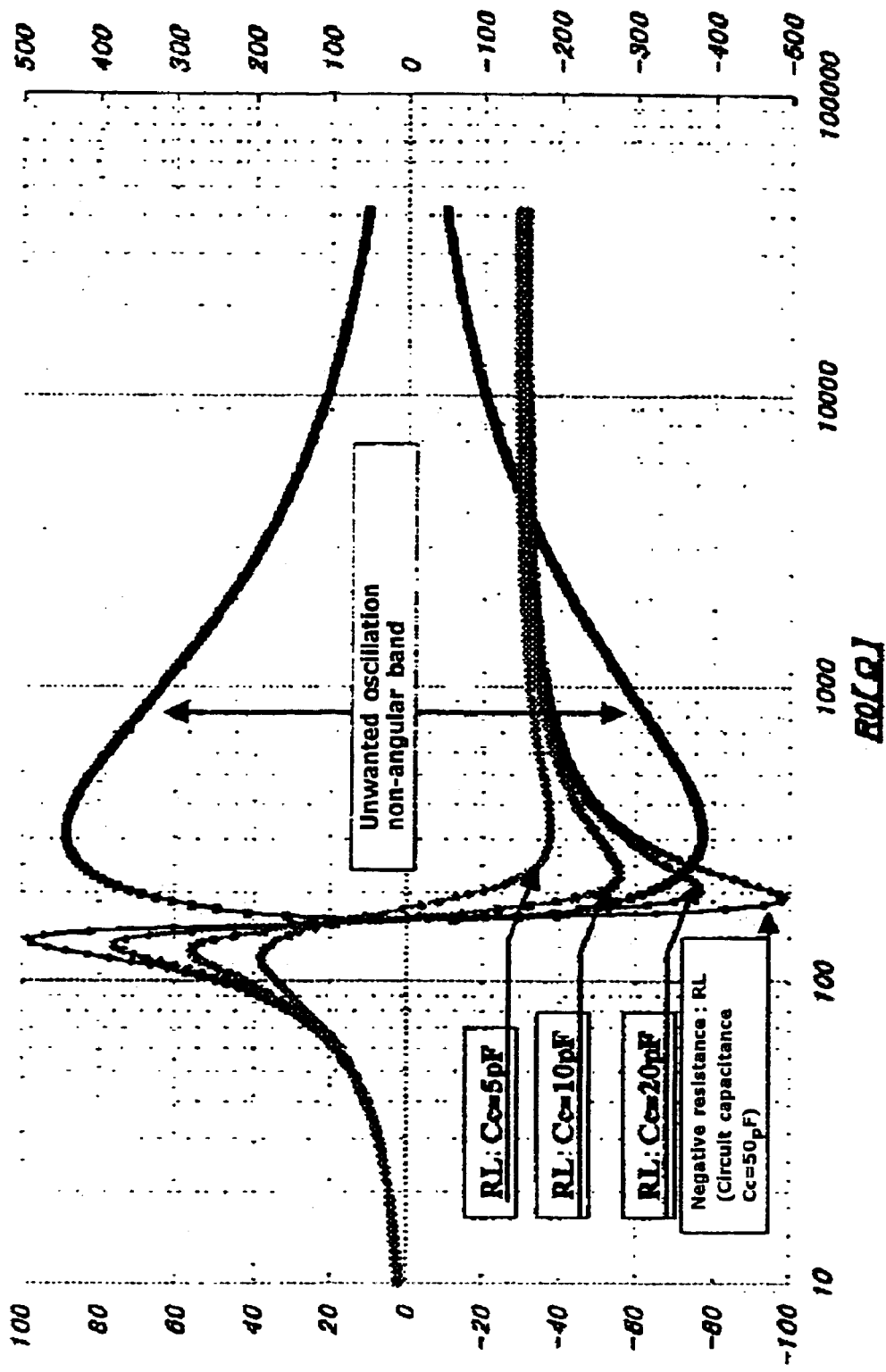
FIG. 19 illustrates a relationship between additional resistance R0, load resistance RL, and unwanted resonance frequency when oscillation frequency is 622 MHz according to the present invention.

FIG. 19 illustrates a relationship with the additional resistance R0, the load resistance RL, and the unwanted resonance frequency when the oscillation frequency is 622 MHz.

The negative resistance of the circuit is −160Ω, and the resistance R0 to the parallel capacitance C0 of the oscillator exceeds the absolute value of this negative resistance. Therefore, an unwanted resonance non-angular bandwidth occurs. A maximum bandwidth of about 170 MHz is obtained at about 300Ω. The negative resistance of a series arm of the piezoelectric vibrator consisting of the C1/L1/R1 decreases when the circuit capacitance becomes smaller, and has a maximum value when the R0 is between 200Ω and 300Ω. This value becomes about −500Ω which is about three times the negative resistance −160Ω of the circuit, when Cc=50 pF.

Figure 20:
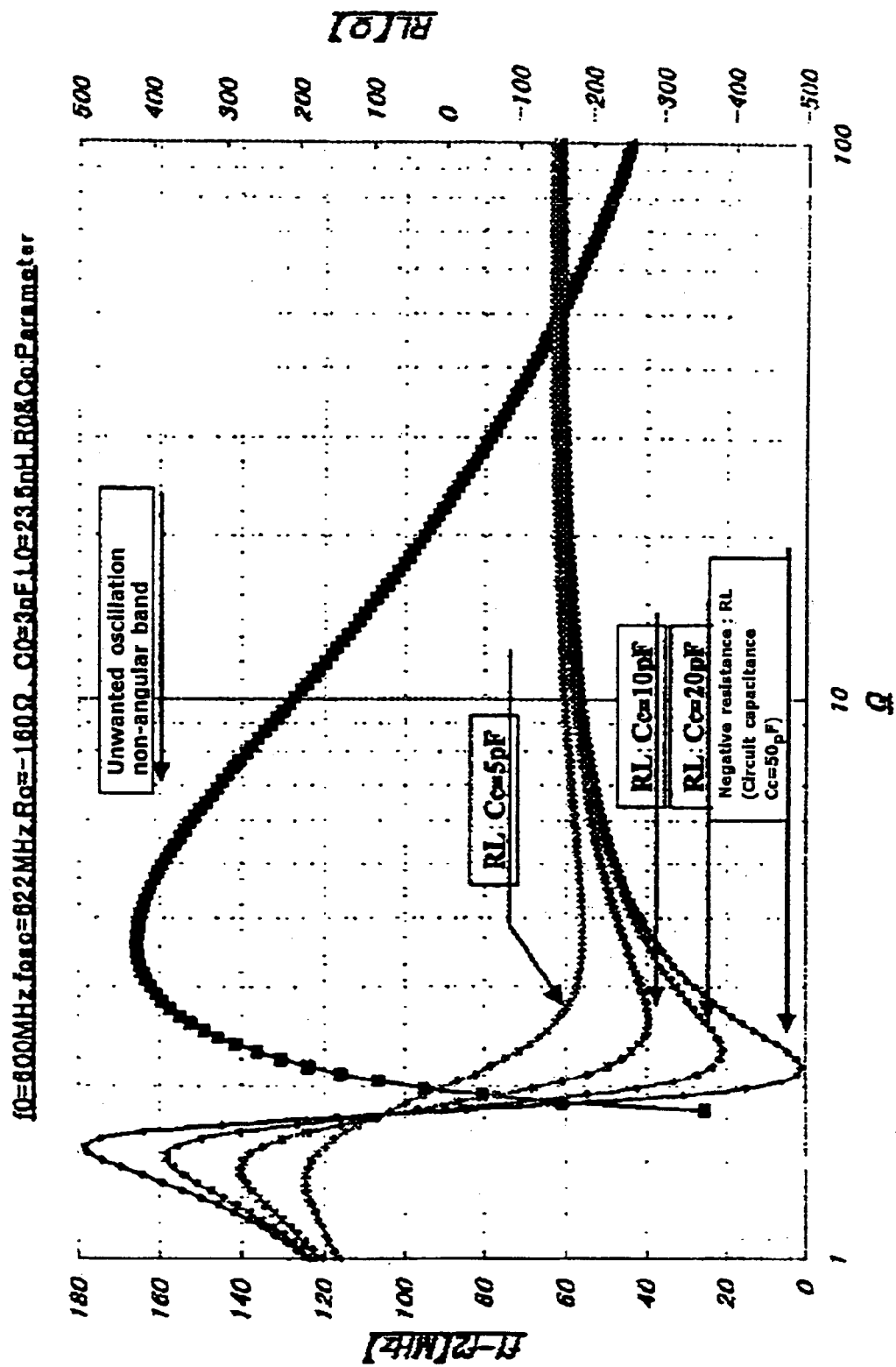
FIG. 20 illustrates a relationship between Q, negative resistance RL, and unwanted resonance bandwidth, where the Q changes by changing the additional resistance R0 in the parallel resonance of C0/L0/R0 when the parallel resonance frequency f0=600 MHz, according to the present invention.

FIG. 20 illustrates a relationship with Q at the parallel resonance of C0/L0/R0, the load resistance RL, and the unwanted resonance bandwidth, where the Q changes by changing the resistance R0. The parallel resonance frequency f0=600 MHz.

The negative resistance of the series arm shows a maximum value when Q is between 2 and 3, and the unwanted resonance bandwidth shows a maximum value when Q is between 3 and 4. The bandwidth naturally becomes smaller when Q becomes larger.

Figure 21:
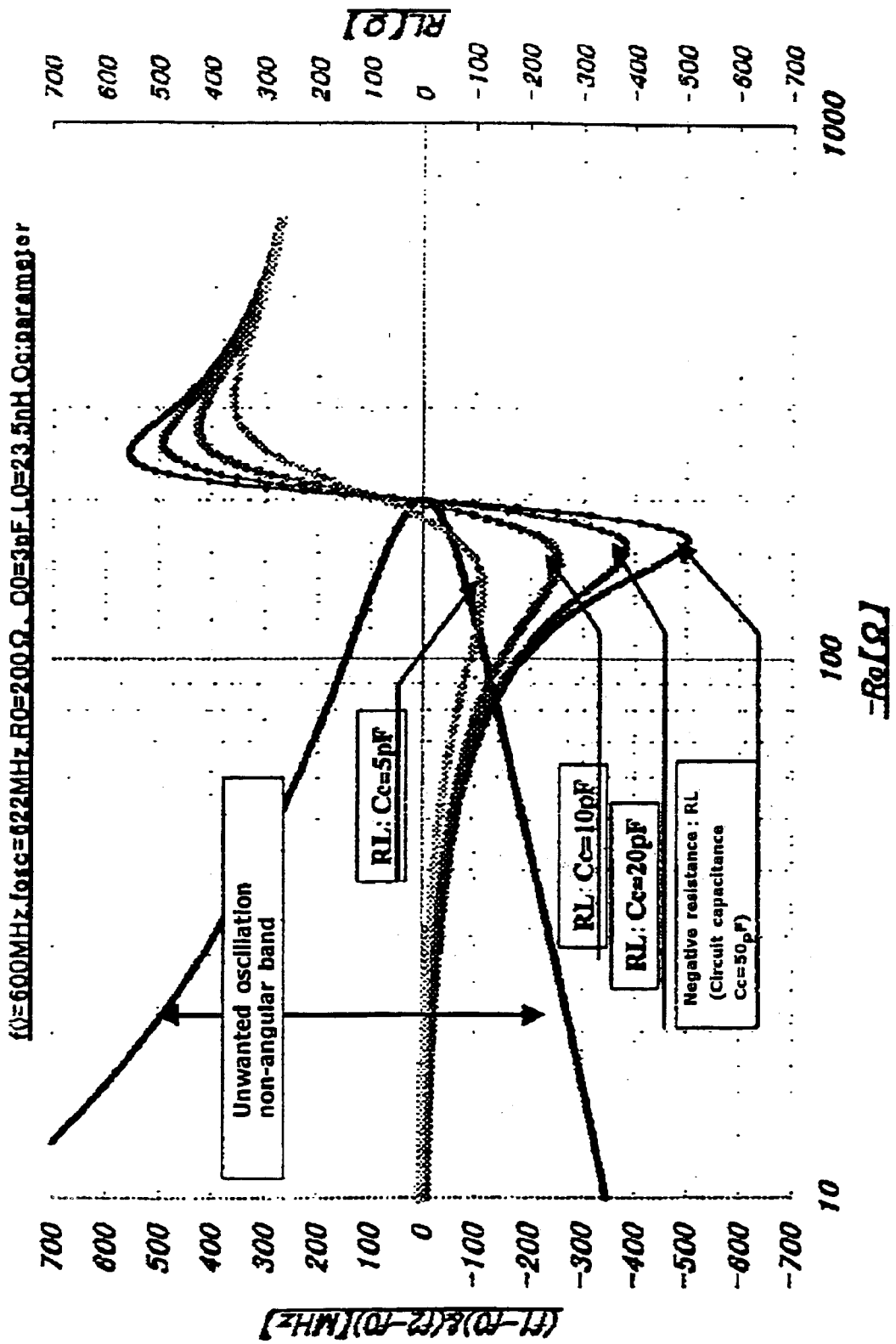
FIG. 21 illustrates a relationship between negative resistance of a series arm and unwanted resonance bandwidth when the additional resistance is fixed to R0=200Ω and when the negative resistance of the circuit is variable.
Figure 2:
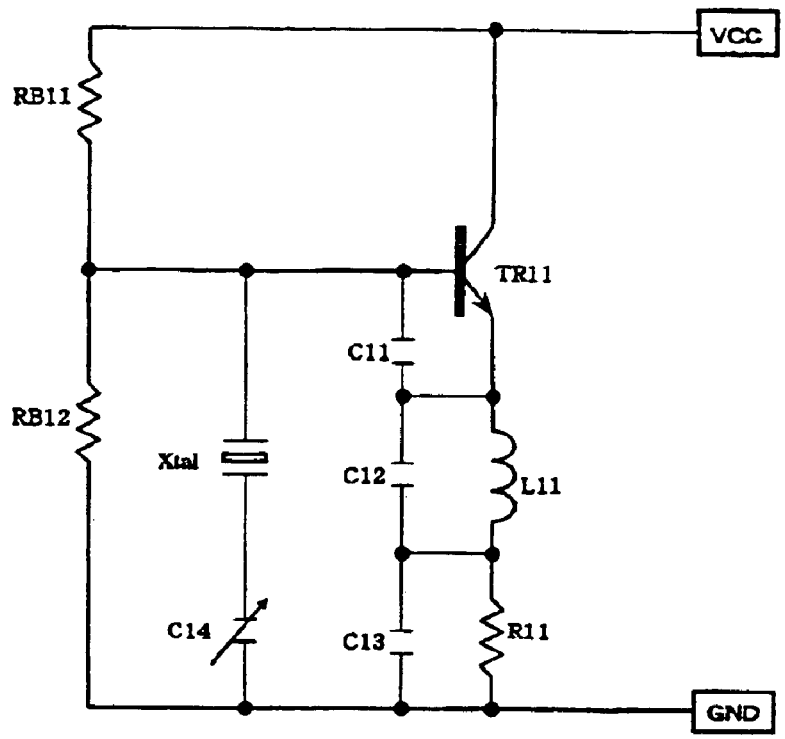
Figure 2:
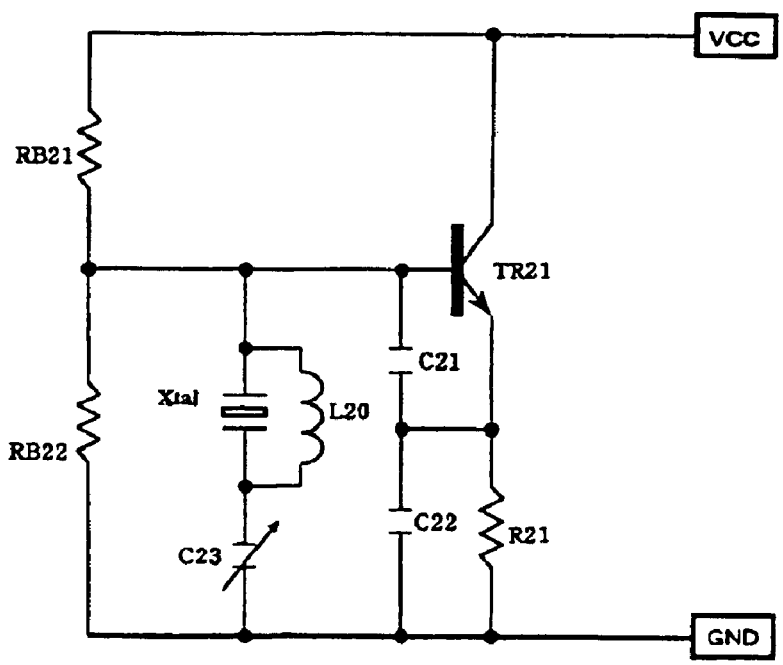
Figure 24:
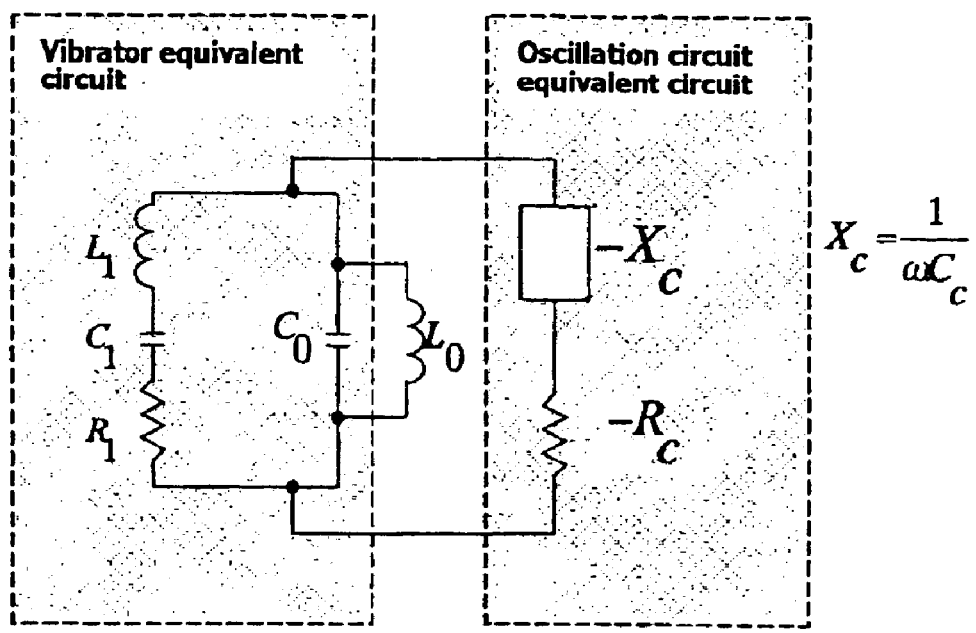
FIG. 24 illustrates an equivalent circuit model of a conventional circuit.

FIG. 21 illustrates a relationship between the negative resistance of the series arm and the unwanted resonance bandwidth when the additional resistance is fixed to R0=200Ω and when the negative resistance of the circuit is variable.

The negative resistance of the series arm falls rapidly and the unwanted resonance bandwidth becomes larger when the negative resistance of the circuit becomes smaller. Particularly, the unwanted resonance bandwidth spreads large to the high frequency side.

As explained above, the negative resistance of the series arm of the oscillator can be made larger when the inductor and the resistor of proper resistance are added to the parallel capacitance of the oscillator. At the same time, unwanted resonance can be suppressed by adding the inductor. When the piezoelectric vibrator is used for the oscillator, the electrode that excites the vibrator cannot be removed from the vibrator. The vibrator becomes thinner when the frequency becomes higher. Therefore, the interelectrode capacitance increases. This is a crucial problem of the piezoelectric vibrator. To overcome the problem, the interelectrode capacitance (i.e., parallel capacitance) of the vibrator can be cancelled or bad influence can be minimized by adding the resistor of proper resistance in the present invention. In other words, it is anticipated that the future piezoelectric oscillator can be adapted to higher frequency. As a result, the invention can greatly contribute to the device or system that uses the piezoelectric vibrator.

As explained above, according to the first aspect of the present invention, a resistor and an inductor, those values are proper respectively, are connected in parallel to the piezoelectric vibrator. Therefore, the interelectrode capacitance due to the high-frequency piezoelectric oscillation can be decreased, and oscillation due to unwanted resonance can be suppressed. Consequently, high stability can be obtained.

According to the second aspect of the present invention, a variable capacitance diode is connected in series to the inductor. Therefore, the capacitance of the inductor can be made variable by externally applying a voltage. Consequently, the oscillation can be optimized, and frequency can be controlled.

According to the third aspect of the present invention, a variable capacitance diode is connected in series to a parallel resonance circuit. Therefore, the capacitance of the inductor can be made variable by externally applying a voltage. Consequently, the oscillation can be optimized, and frequency can be controlled.

According to the fourth aspect of the present invention, a proper equivalent circuit can accurately determine proper additional resistance and inductance based on oscillation frequency.

According to the fifth and sixth aspects of the present invention, an inductor and a resistor of proper resistance are added to the parallel capacitance of the oscillator. Therefore, the negative resistance of the series arm of the oscillator can be increased, and unwanted resonance due to the addition of the inductor can be restricted.

What is claimed is:

1. A high-frequency piezoelectric oscillator including a piezoelectric vibrator having a piezoelectric element that is excited in a predetermined frequency, and an oscillation amplifier that oscillates the piezoelectric element by flowing current to the piezoelectric element, wherein an inductor and a resistor are insertion connected in parallel respectively to the piezoelectric vibrator of the high-frequency piezoelectric oscillator, and resonance frequency of a parallel resonance circuit consisting of the inductor and the resistor is set to the vicinity of the oscillation frequency of the high-frequency piezoelectric oscillator thereby to increase negative resistance applied to a series arm of the piezoelectric element and suppress unwanted oscillation due to the inductor.

2. A high-frequency piezoelectric oscillator including a piezoelectric oscillator having a piezoelectric vibrator that is excited in a predetermined frequency, and an oscillation amplifier that oscillates the piezoelectric vibrator by flowing current to a piezoelectric element, wherein a circuit having an inductor and a variable capacitance diode connected in series and a resistor are insertion connected in parallel respectively to the piezoelectric vibrator of the high-frequency piezoelectric oscillator, resonance frequency of a parallel resonance circuit consisting of the inductor and the resistor is set to the vicinity of the oscillation frequency of the high-frequency piezoelectric oscillator, thereby to increase negative resistance applied to a series arm of the piezoelectric element and externally fine adjust the capacitance of the variable capacitance diode so as to optimize oscillation and make it possible to control frequency.

3. A high-frequency piezoelectric oscillator including a piezoelectric oscillator having a piezoelectric vibrator that is excited in a predetermined frequency, and an oscillation amplifier that oscillates the piezoelectric vibrator by flowing current to a piezoelectric element, wherein a first inductor and a resistor are connected in parallel respectively to the piezoelectric vibrator of the high-frequency piezoelectric oscillator, the connection point is grounded via a circuit having a second inductor and a variable capacitance diode connected in series, and resonance frequency of a parallel resonance circuit consisting of the first inductor and the resistor is set to the vicinity of the resonance frequency of the high-frequency piezoelectric oscillator, thereby to increase negative resistance applied to a series arm of the piezoelectric element and externally fine adjust the capacitance of the variable capacitance diode so as to optimize oscillation and make it possible to control frequency.

4. A high-frequency piezoelectric oscillator according to any one of claims 1 to 3, wherein the following relationships are fulfilled:

$$R_1 + R_L = 0 \quad (I)$$

$$\cdot \omega L_1 + \frac{1}{\omega \cdot C_1} + X_L = 0$$

when $$X_0 = \frac{1}{\omega C_0} \times \frac{1}{\left(1 - \frac{\omega_0^2}{\omega^2}\right)} = \frac{1}{\omega C_0} \times \frac{1}{\left(\frac{\omega_0^2}{\omega^2} - 1\right)}$$

$$z_0 = \frac{R_0 X_0^2}{R_0^2 + X_0^2} + j \frac{X_0 R_0^2}{R_0^2 + X_0^2}$$

$$r_\alpha = \frac{R_0 X_0^2}{R_0^2 + X_0^2}, \ldots X_\alpha = \frac{X_0 R_0^2}{R_0^2 + X_0^2}.$$

$$Z_L = \frac{-r_\alpha R_c + X_\alpha X_c - j(X_\alpha R_c + X_c r_\alpha)}{r_\alpha - R_c + j(X_\alpha - X_c)}, \ldots$$

$$A = r_\alpha - R_c, \ldots B = X_\alpha - X_c, \ldots C = R_c^2 + X_c^2, \ldots D = r_\alpha^2 + X_\alpha^2$$

$$R_L = \frac{r_\alpha \times C - R_c \times D}{A^2 + B^2}, \ldots X_L = \frac{X_c \times D - X_\alpha \times C}{A^2 + B^2},$$

where $-Rc$ represents the negative resistance, $Cc$ represents circuit capacitance, $C0$ represents interelectrode capacitance of the piezoelectric vibrator, $X0$ represents reactance of a parallel circuit of the inductor $L0$, $R0$ represents resistance of the resistor, $-Xc$ represents circuit capacitance of the circuit, $r\alpha$ represents parallel connection resistance of the $X0$ and $R0$, $X\alpha$ represents reactance, RL represents negative resistance of the series arm of the oscillator, XL represents reactance, and (I) represents an oscillation condition.

5. A high-frequency piezoelectric oscillator according to claim 1, wherein $\omega_1 < \omega_T < \omega_2$ (Exp. 1) is fulfilled, when $\omega_T$ represents unwanted resonance non-angular frequency, $C_o$ represents interelectrode capacitance of the vibrator, Rc represents an absolute value of negative resistance of an additional resistor and an oscillation circuit that are connected in parallel to the $C_o$, $L_o$ represents an inductor that is connected in parallel to the $C_o$, and $\omega_0$ represents parallel resonance angular frequency of the $C_o$ and $L_o$, where (Exp. 2) to (Exp. 4) is fulfilled $$\ldots \omega_1 = \sqrt{\omega_0^2 + \frac{K - \sqrt{K(K + 4\omega_0^2)}}{2}}, \quad \text{(Exp. 2)}$$

$$\ldots \omega_2 = \sqrt{\omega_0^2 + \frac{K + \sqrt{K(K + 4\omega_0^2)}}{2}},$$

$$\ldots K = \frac{M}{C_0^2 R_0^2}, \ldots M = \frac{R_0}{R_c} - 1$$

$$M > 0, R_0 > Rc$$

$$\ldots \cdot_T = \cdot_2 - \cdot_1 = \sqrt{\frac{K^2}{4 \cdot_0^2} + K} = \frac{\cdot_0}{2Q_0} \sqrt{M(4Q_0 + M)} \quad \text{(Exp. 3)}$$

T: unwanted resonance non-angular bandwidth $$\ldots Q = \frac{R_0}{\cdot_0 L_0} = \cdot_0 C_0 R_0 \quad \text{(Exp. 4)}$$

the (Exp. 1) represents unwanted resonance non-angular bandwidth, (Exp. 2) represents a condition for fulfilling the (Exp. 1), and (Exp. 3) represents an unwanted band, (Exp. 5) is fulfilled, where $$R_L = \frac{r_\cdot \times C - R_c \times D}{A^2 + B^2} \quad X_L = \frac{X_\cdot \times C - X_c \times D}{A^2 + B^2}$$ (Exp. 5)

$$r_\cdot = \frac{R_0 X_0^2}{R_0^2 + X_0^2}, \quad X_\cdot = \frac{X_0 R_0^2}{R_0^2 + X_0^2},$$

$$X_0 = \frac{1}{C_0\left(\frac{\omega_0^2}{\omega^2} - 1\right)}, \quad X_c = \frac{1}{\omega C_c}$$

$$A = r_\cdot - R_c, \quad B = X_\cdot - X_c,$$

$$C = R_c^2 + X_c^2, \quad D = r_\cdot^2 + X_\cdot^2$$

Q represents resonance frequency which is a ratio of a real number to reactance shown by the $\omega_0$ in the (Exp. 4), RL represents the negative resistance for oscillating the series arm consisting of L1/C1/R0 of the oscillator, XL represents reactance, Cc represents circuit capacitance of the oscillation circuit, and ω represents oscillation angular frequency, and (Exp. 5) represents negative resistance and load capacitance for oscillating a series arm consisting of L1/C1/R0 of the oscillator.

6. A high-frequency piezoelectric oscillator according to any one of claims 1, 2, and 3, wherein the resistance within a range according to claim 5 is organized within an inductor, and the inductor having the inductor and the resistor integrated together is connected in parallel to the interelectrode capacitance C0 of the vibrator.

7. A high-frequency piezoelectric oscillator according to claim 4, wherein the resistance within a range according to claim 5 is organized within an inductor, and the inductor having the inductor and the resistor integrated together is connected in parallel to the interelectrode capacitance C0 of the vibrator.

* * * * *